United States Patent
Laroia et al.

(10) Patent No.: US 8,630,598 B2
(45) Date of Patent: Jan. 14, 2014

(54) METHODS AND APPARATUS FOR MEASURING AND/OR USING TRANSMITTER AND/OR RECEIVER IQ IMBALANCE INFORMATION AND/OR DC OFFSET INFORMATION

(75) Inventors: Rajiv Laroia, Far Hills, NJ (US); Juergen Cezanne, Ocean Township, NJ (US); Aleksandar Jovicic, Jersey City, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 612 days.

(21) Appl. No.: 12/712,330

(22) Filed: Feb. 25, 2010

(65) Prior Publication Data

US 2011/0207418 A1 Aug. 25, 2011

(51) Int. Cl.
*H04B 1/08* (2006.01)

(52) U.S. Cl.
USPC .......................... 455/149; 330/149; 330/156

(58) Field of Classification Search
USPC .................................. 455/126; 330/149, 156
See application file for complete search history.

(56) References Cited

U.S. PATENT DOCUMENTS

| | | | |
|---|---|---|---|
| 6,054,896 A * | 4/2000 | Wright et al. | 330/149 |
| 6,868,128 B1 | 3/2005 | Lane | |
| 2006/0034356 A1 | 2/2006 | Fechtel | |
| 2009/0119043 A1* | 5/2009 | Tao et al. | 702/66 |

FOREIGN PATENT DOCUMENTS

WO 2008009633 A2 1/2008

OTHER PUBLICATIONS

International Search Report—PCT/US2011/026226—International Search Authority, European Patent Office, Jun. 6, 2011.
Written Opinion—PCT/US2011/026226—ISA/EPO—Jun. 6, 2011.

* cited by examiner

*Primary Examiner* — Yuwen Pan
*Assistant Examiner* — Ankur Jain
(74) *Attorney, Agent, or Firm* — Joseph B. Agusta

(57) ABSTRACT

A wireless communications device, e.g., a mobile node supporting direct peer to peer communications, performs a self-calibration of one or more of: receiver IQ imbalance, transmitter IQ imbalance, receiver DC offset, and transmitter DC offset. The wireless communications device, operating in calibration mode, intentionally sets the oscillator frequency used for downconversion in its receiver module to a different frequency than the oscillator frequency used for upconversion in its transmitter module. A first baseband signal, e.g., a single tone test signal, is input to the transmitter module and an upconverted transmit signal is generated. The transmit signal is routed via a feedback loop to the receiver, which performs a downconversion operation. Power and/or phase measurements of the signals output from the downconversion are used to determine IQ imbalance compensation information and DC offset compensation information. The determined compensation information is used subsequently when operating in a communications mode of operation.

22 Claims, 20 Drawing Sheets

| FIGURE 6A | FIGURE 6A | FIGURE 6A |

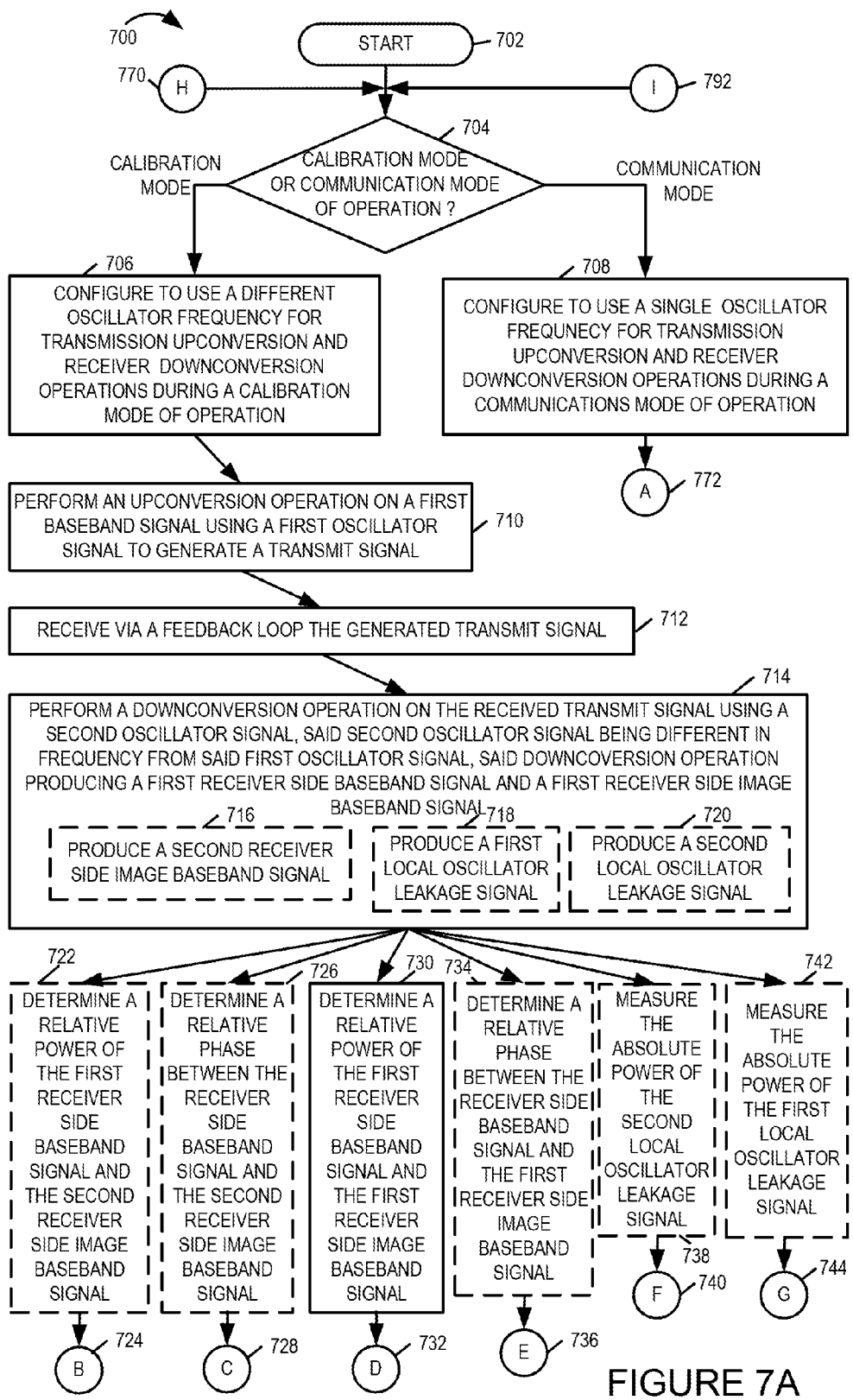

| FIGURE 9A | FIGURE 9A | FIGURE 9A |

METHODS AND APPARATUS FOR MEASURING AND/OR USING TRANSMITTER AND/OR RECEIVER IQ IMBALANCE INFORMATION AND/OR DC OFFSET INFORMATION

FIELD OF THE INVENTION

Various embodiments relate to wireless communications, and more particularly, to methods and apparatus for measuring and/or using IQ imbalance information and/or DC offset information.

BACKGROUND OF THE INVENTION

In-phase and Quadrature phase signal imbalance, commonly referred to as IQ imbalance, occurs when the gains and/or phases differ in the In-phase and Quadrature paths of a zero-IF (a.k.a. direct down/up-conversion) transmitter or receiver. In the case of single-tone transmissions, the IQ imbalance manifests itself as an image tone at frequency fc−f when an intended signal is sent at frequency fc+f by the transmitter. DC offset occurs when the local oscillator, which is used to generate the carrier frequency either at the transmitter or at the receiver, leaks into the transmitted signal after upconversion or into the received signal before downconversion. At RF frequencies, the DC offset is manifested as a tone at the local oscillator frequency. If either of these impairments is left unmitigated, the achievable reliability of decoding/detection may, and often is, reduced.

IQ imbalance and DC offset typically occur both at the transmitter and at the receiver. A measurement procedure that can efficiently differentiate between transmitter-side impairments and receiver-side impairments would be useful since such measurements would allow for separate compensation to be performed depending on the source of the signal impairment. In many cellular applications, measurements and calibrations of IQ imbalance and/or DC offset are typically performed off-line before mobile device deployment. However, factory calibrations may be inaccurate in the field, e.g., due to component aging, temperature variation, power supply variation, environmental interference, and/or changes in the environment or operating conditions in which a device is used. In some cellular cases, measurements are done on-line wherein a mobile device listens to pilots transmitted by a base-station and bases its compensation upon those measurements. However, in such an approach only the combined effect of base-station transmitter's IQ imbalance and mobile device receiver's IQ imbalance is computed and obtained.

In wireless peer-to-peer networks, measuring and compensating both transmitter and receiver IQ imbalance corresponding to an individual device is very important. This is because there is typically a large dynamic range of signals operating concurrently in the same band. In addition in a peer to peer network, a device may communicate directly with a plurality of different devices in a relatively short period of time.

In view of the above, it should be appreciated that there is a need for methods and/or apparatus for measuring receiver and transmitter side induced IQ imbalance. It is desirable that at least some methods be suited for making such measurement after a device is deployed for use.

SUMMARY OF THE INVENTION

Various described methods and apparatus are particularly well suited to IQ imbalance mitigation and/or DC offset mitigation in peer to peer wireless communications networks. A wireless communications device, e.g., a mobile node supporting direct peer to peer communications, performs a self-calibration of one or more of: receiver IQ imbalance, transmitter IQ imbalance, receiver DC offset, and transmitter DC offset.

In accordance with a feature of some embodiments, the wireless communications device, operating in calibration mode, intentionally sets the oscillator frequency used for downconversion in its receiver module to a different frequency than the oscillator frequency used for upconversion in its transmitter module. A first baseband signal, e.g., a single tone test signal, is input to the transmitter module and an upconverted transmit signal is generated. The transmit signal is routed via a feedback loop in the device to the receiver, which performs a downconversion operation. The result of the downconversion includes a first receiver side baseband signal, a first receiver side image baseband signal, a second receiver side image baseband signal, a first oscillator leakage signal and a second oscillator leakage signal.

The intentional separation, e.g., frequency difference between, the oscillator frequency used for upconversion and the oscillator frequency used for downconversion results in the transmitter induced image signal occurring at a different frequency than the receiver induced image signal. In addition, the intentional separation of the oscillator frequency used for upconversion and the oscillator frequency used for downconversion results in the transmitter induced local oscillator leakage signal occurring at a different frequency than the receiver induced local oscillator leakage signal. This allows for measurement of the receiver and transmitter induced signal impairments without the need or use of an external calibration device or communication peer to provide feedback information.

Relative power and/or relative phase measurements between the first receiver side bandband signal and the image signals are used to generate receiver and transmitter IQ imbalance compensation values. Absolute power measurements of the local oscillator leakage signals are used to generate transmitter DC offset compensation value and a receiver DC offset compensation value. Such measurements may occur during a calibration mode of operation. Subsequently, during a communications mode of operation, the determined compensation values are used to correct receiver and/or transmitter induced errors. In some embodiments the device switches between calibration and communications modes of operation on a regular or predetermined basis. Thus, the device may perform self-calibration relating to IQ imbalance after it is deployed, e.g., with the effects of changes in the operating environment and/or device operating conditions being reflected in the measurement results.

An exemplary method of operating a wireless communications device, in accordance with some embodiments, comprises: performing an upconversion operation on a first baseband signal using a first oscillator signal to generate a transmit signal, and receiving via a feedback loop the generated transmit signal. The exemplary method further comprises: performing a downconversion operation on the received transmit signal using a second oscillator signal, said second oscillator signal being different in frequency from said first oscillator signal, said downconversion operation producing a first receiver side baseband signal and a first receiver side image baseband signal, and determining a relative power of the first receiver side baseband signal and first receiver side image baseband signal.

An exemplary wireless communications device, in accordance with some embodiments, comprises at least one processor configured to: perform an upconversion operation on a first baseband signal using a first oscillator signal to generate a transmit signal, receive via a feedback loop the generated transmit signal, and perform a downconversion operation on the received transmit signal using a second oscillator signal. The second oscillator signal is different in frequency from said first oscillator signal, and said downconversion operation produces a first receiver side baseband signal and a first receiver side image baseband signal. The exemplary processor is further configured to determine a relative power of the first receiver side baseband signal and first receiver side image baseband signal. The exemplary wireless communications device further includes memory coupled to said at least one processor.

While various embodiments have been discussed in the summary above, it should be appreciated that not necessarily all embodiments include the same features and some of the features described above are not necessary but can be desirable in some embodiments. Numerous additional features, embodiments and benefits of various embodiments are discussed in the detailed description which follows.

BRIEF DESCRIPTION OF THE FIGURES

FIG. 7A is a first part of a flowchart of an exemplary method of operating a wireless communications device in accordance with various exemplary embodiments.

DETAILED DESCRIPTION

Figure 1:
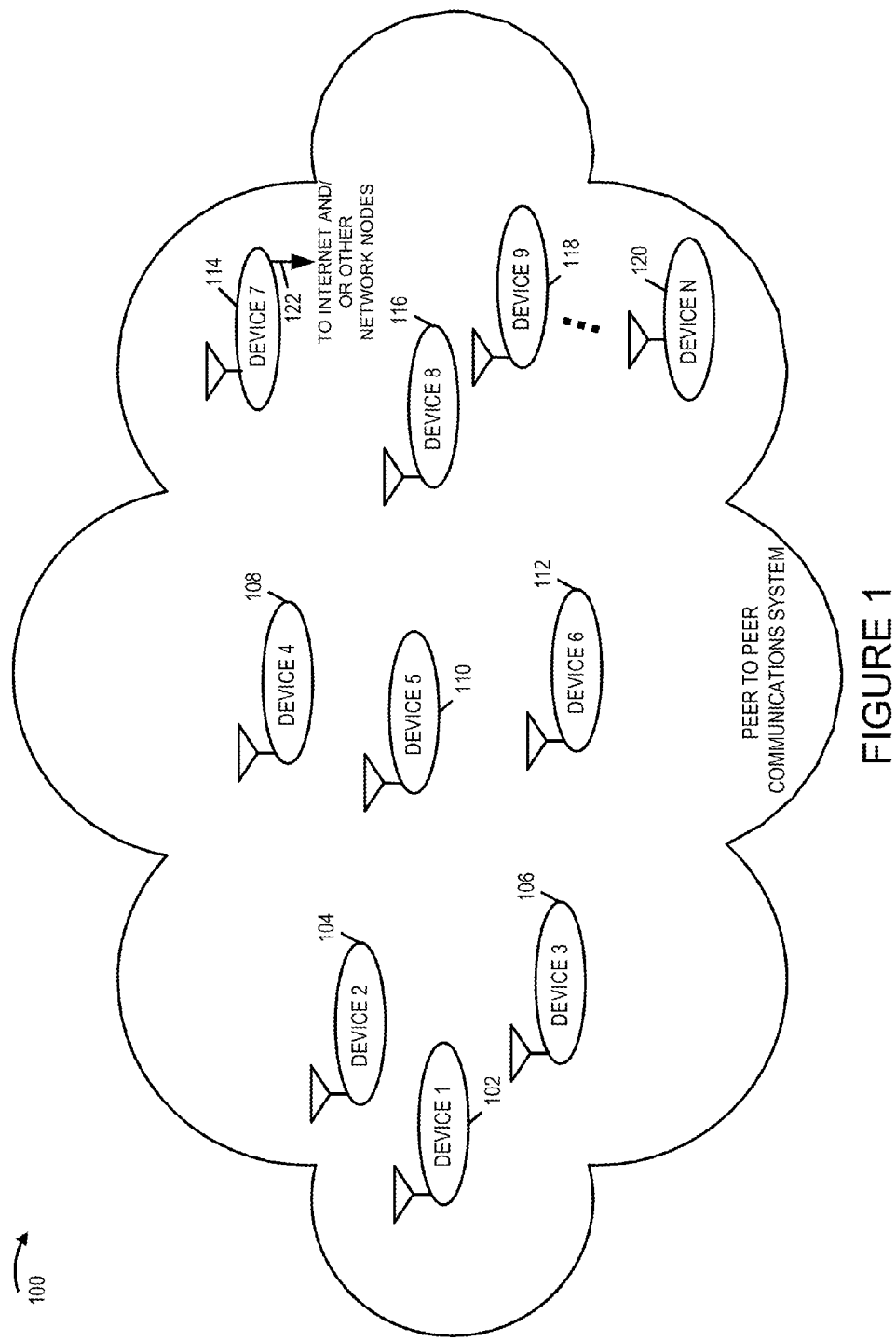
FIG. 1 is a drawing of an exemplary wireless peer to peer communications system in accordance with an exemplary embodiment.

FIG. 1 is a drawing of an exemplary wireless peer to peer communications system 100 in accordance with an exemplary embodiment. Exemplary wireless peer to peer communications system 100 includes a plurality of wireless communications devices (device 1 102, device 2 104, device 3 106, device 4 108, device 5 110, device 6 112, device 7 114, device 8 116, device 9 118, . . . , device N 120. Some of the wireless communications devices in system 100, e.g., device 7 114, include an interface 122, to the Internet and/or other network nodes. Some of the wireless communications devices in system 100, e.g., device 1 102, device 2 104, device 3 106, device 4 108, device 5 110, device 6 112, device 8 116, device 9 118 and device N 120, are mobile wireless communications devices, e.g., handheld mobile devices.

A wireless communications device, e.g., device 1 102, in system 100 determines one or more of: transmitter IQ imbalance information, receiver IQ imbalance information, and DC offset information. The determination is based on power and/or phase measurements of signals produced by downconversion operations while operating in a calibration mode of operation. In accordance with a feature of some embodiments, during the calibration mode, the oscillator frequency used in the upconversion is set to be intentionally different from the oscillator frequency used in the downconversion, e.g., to facilitate separation between errors induced in the transmitter and errors induced in the receiver. The wireless communications device uses its self-determined transmitter IQ imbalance information, receiver IQ imbalance information, and/or DC offset information, e.g., to compensate and/or remove self-induced transmitter and/or receiver errors, when transmitting and/or receiving, while operating in a communications mode of operation. The communications mode of operation, in some embodiments, follows the calibration mode of operation. In some embodiments, calibration modes and communications modes are interwoven, e.g., with the wireless communications device performing calibration operations during convenient time intervals in which it is not communicating with another device, e.g., during a time interval when it might otherwise be in a sleep state.

In some embodiments, a wireless communications device enters the calibration mode and determines one of more of: transmitter IQ imbalance information, receiver IQ imbalance information, and DC offset information, as part of initialization following power on. Subsequent to the power on initialization, the wireless communications device operates in a communications mode of operation. In some such embodiments, the wireless communications device updates one or more of: transmitter IQ imbalance information, receiver IQ imbalance information, and DC offset information, at a subsequent time interval when the wireless communications device is again controlled to operate in the calibration mode of operation.

Figure 2:
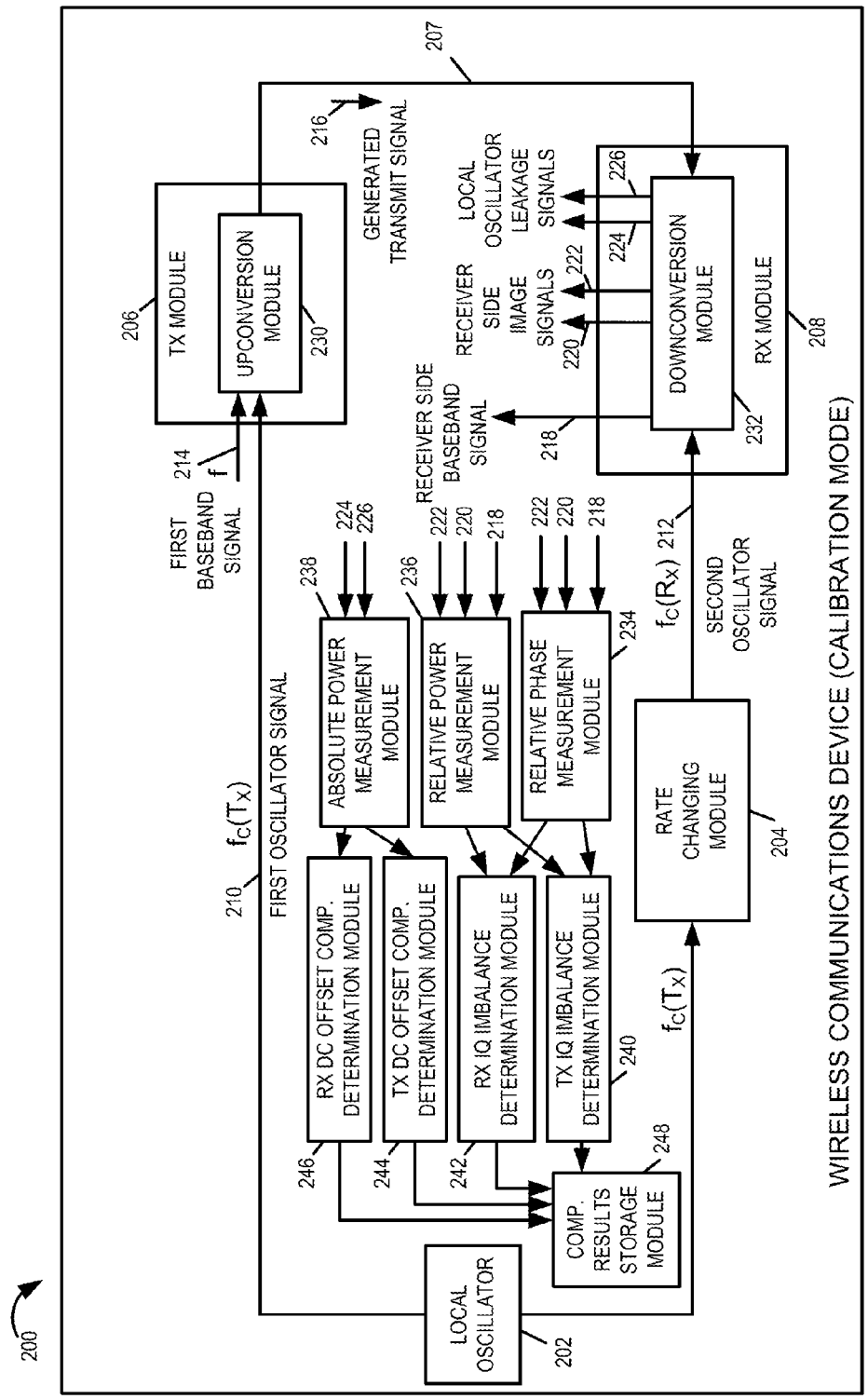
FIG. 2 is a drawing of an exemplary wireless communications device, which may be any of the wireless communications devices of the system of FIG. 1.

FIG. 2 is a drawing of an exemplary wireless communications device 200, which may be any of the wireless communications devices of system 100 of FIG. 1. FIG. 2 is used to illustrate some exemplary features and signaling during the calibrations mode of operation, in accordance with some embodiments. Wireless communications device 200 includes a local oscillator 202, a rate changing module 204, a transmitter module 206 and a receiver module 208. The transmitter module 206 includes an upconversion module 230, while the receiver module 208 includes a downconversion module 232. The local oscillator produces a first oscillator signal 210 at frequency fc(Tx) which is supplied as an input to the upconversion module 230 and the rate changing module 204. The rate changing module 204, changes the supplied frequency fc(Tx) and generates a second oscillator signal 212 which is at second oscillator frequency fc(Rx). The second oscillator signal at frequency fc(Rx) is supplied as an input to the downconversion module 232.

A first baseband signal 214 at frequency f is supplied as an input to the upconversion module. In some embodiments, the first baseband signal is a single tone test signal, e.g., a predetermined single tone test signal having a known power level and known phase. The upconversion module 230 performs an upconversion operation on the first baseband signal to generate transmit signal 216. A feedback loop 207 is used within wireless communications device 200 to route generated transmit signal 216 to an input of the downconversion module 232. The downconversion module 232 performs a downconversion operation on the received generated transmit signal 216, using the second oscillator signal 212, to produce a receiver side baseband signal 218, receiver side image signals (220, 222) and local oscillator leakage signal (224, 226).

Wireless communications device 200 further includes a relative power measurement module 236, a relative phase measurement module 234, an absolute power measurement module 238, a transmitter IQ imbalance determination module 240, a receiver IQ imbalance determination module 242, a transmitter DC offset compensation module 244, a receiver DC offset determination module 246 and a compensation results storage module 248. The receiver side baseband signal 218 and the receiver side image signals (220, 222) are inputs to the relative phase measurement module 234 and the relative power measurement module 236. Corresponding to receiver side baseband signal 218 and receiver side image signal 220, the relative power measurement module 236 and the relative phase measurement module 234 produce a relative power measurement and a relative phase measurement, which are inputs to the TX IQ imbalance determination module 240. The TX IQ imbalance determination module 240 generates a TX IQ imbalance compensation value as a function of the input relative power and phase measurements, and the result is stored by compensation results storage module 248, e.g., to be used later during the communications mode of operation when transmitting.

Corresponding to receiver side baseband signal 218 and receiver side image signal 222, the relative power measurement module 236 and the relative phase measurement module 234 produce a relative power measurement and a relative phase measurement, which are inputs to the RX IQ imbalance determination module 242. The RX IQ imbalance determination module 242 generates a RX IQ imbalance compensation value as a function of the input relative power and phase measurements, and the result is stored by compensation results storage module 248, e.g., to be used later during the communications mode of operation when receiving.

Local oscillator leakage signal 224 is an input to absolute power measurement module 238 which measures the power of signal 224 and sends the result to TX DC offset compensation module 244. TX DC offset compensation module 244 determines a DC offset compensation value, and the result is stored by compensation results storage module 248, e.g., to be used later during the communications mode of operation when transmitting.

Local oscillator leakage signal 226 is an input to absolute power measurement module 238 which measures the power of signal 226 and sends the result to RX DC offset compensation module 246. RX DC offset compensation module 246 determines a DC offset compensation value, and the result is stored by compensation results storage module 248, e.g., to be used later during the communications mode of operation when receiving.

At a time subsequent to the calibration, wireless communications device 200 is controlled to operate in a communications mode of operation, e.g., a peer to peer communications mode of operation. During the communications mode of operation the feedback loop connection 207 is broken. During the communications mode of operation, in some embodiments, wireless communications device 200 is controlled to use the same frequency, e.g., fc(Tx), as the input to both the upconversion module 230 and the downconversion module 232. For example, rate changing module 204, is bypassed in the communications mode of operation. In the communications mode of operation, when the wireless communications device 300 is transmitting the wireless communications device retrieves and uses the stored TX IQ imbalance information and the stored TX DC offset compensation information to correct the transmitted signal, e.g., compensating for errors introduced by the transmitter module 206. In the communications mode of operation, when the wireless communications device 200 is receiving, the wireless communications device 200 retrieves and uses the stored RX IQ imbalance information and the stored RX DC offset compensation information to correct the received signal, e.g., compensating for errors introduced by the receiver module 208.

Figure 3:
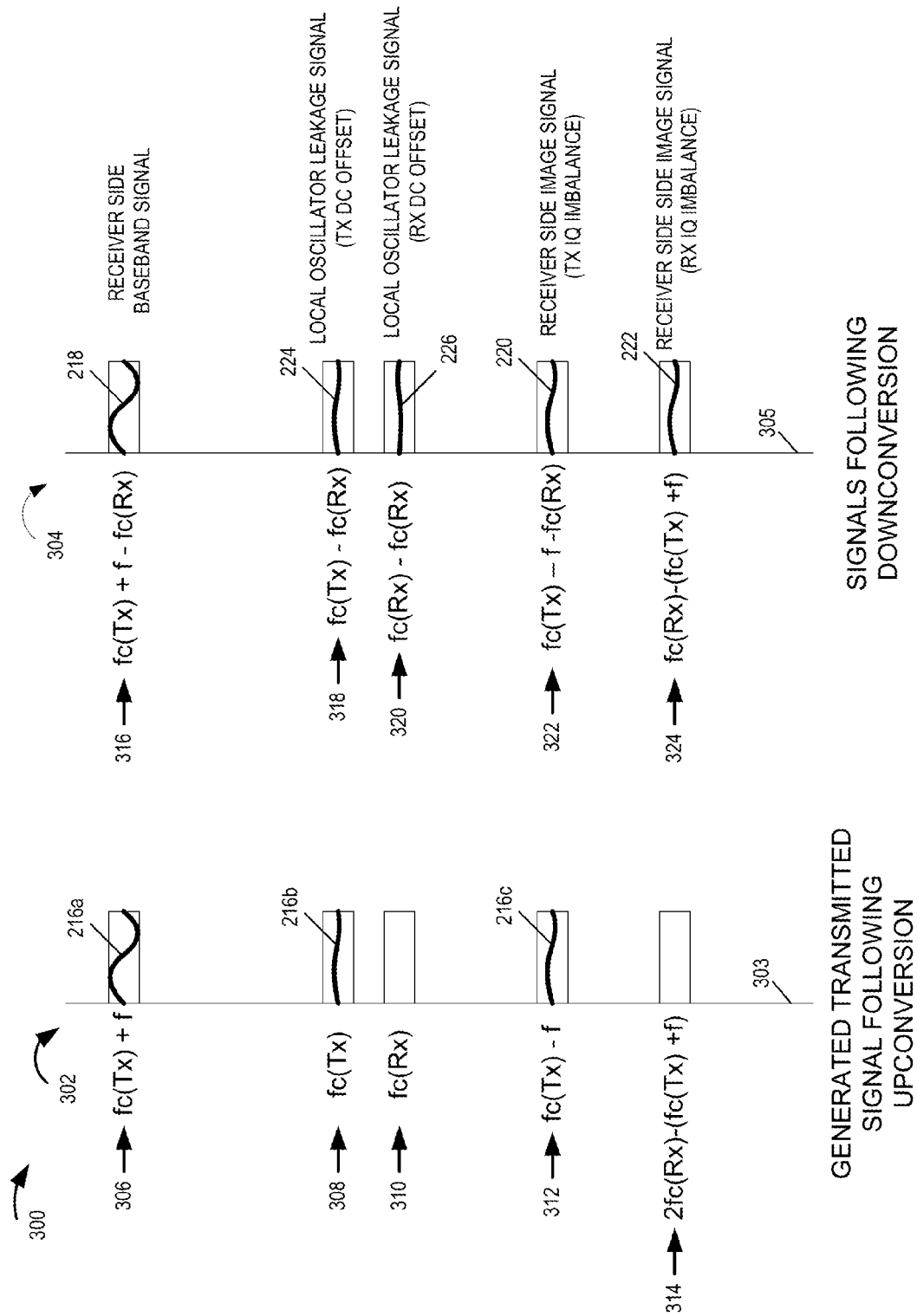
FIG. 3 is a drawing illustrating exemplary signals which are generated and exemplary signals which are measured as part of calibration in accordance with some exemplary embodiments.

FIG. 3 is a drawing 300 illustrating exemplary signals which are generated and exemplary signals which are measured as part of calibration in accordance with some exemplary embodiments. Drawing 302 illustrates exemplary generated transmit signal 216 of FIG. 2, which was generated as a result of performing an upconversion operation on a baseband signal at frequency tone f using first oscillator frequency fc. The vertical axis 303 represents frequency. Signal 216 includes signal component 216a at frequency tone fc(Tx)+f 306, signal component 216b at frequency tone fc(Tx) 308 and signal component 216c at frequency tone fc(Tx)−f. Other tones of interest are frequency tone fc(Rx) 310 and frequency tone 2fx(Rx)−(fc(Tx)+f).

Drawing 304 illustrates exemplary signals which are produced from downconversion performed on signal 216, which has been input to the receiver via a feedback loop. Vertical axis 305 represents frequency. Receiver side baseband signal 218 is produced at frequency tone fc(Tx)+f−fc(Rx) 316. Local oscillator leakage signal 224, which corresponds to TX DC offset, is produced at frequency tone fc(Tx)−fc(Rx) 318. Local oscillator leakage signal 226, which corresponds to RX DC offset, is produced at frequency tone fc(Rx)−fc(Rx) 320. Receiver side image signal 220, which corresponds to TX IQ imbalance, is produced at frequency fc(Tx)−f−fc(Rx) 322. Receiver side image signal 222, which corresponds to RX IQ imbalance, is produced at frequency fc(Rx)−(fc(Tx)+f) 324.

Figure 4A:
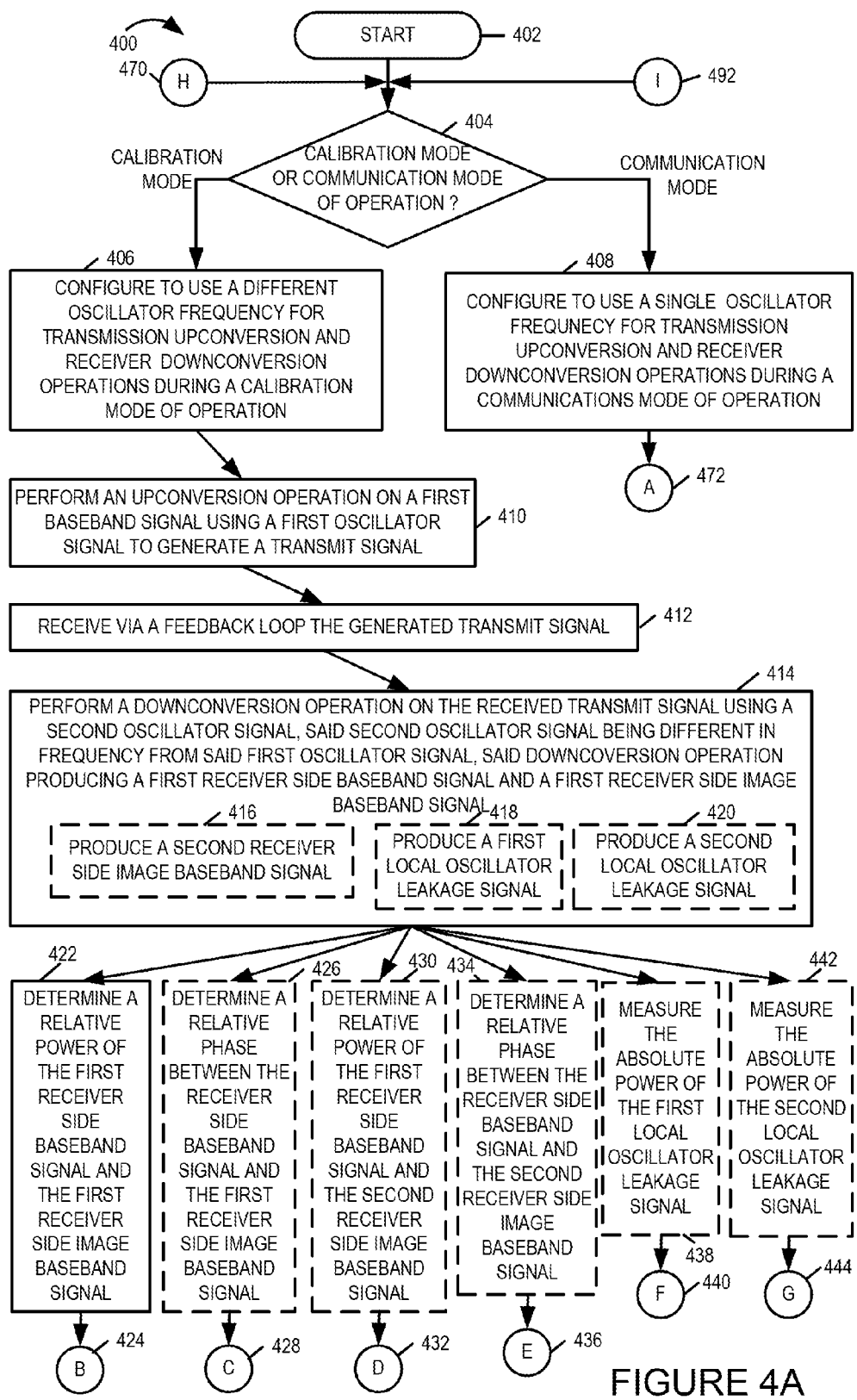
FIG. 4A is a first part of a flowchart of an exemplary method of operating a wireless communications device in accordance with various exemplary embodiments.
Figure 4B:
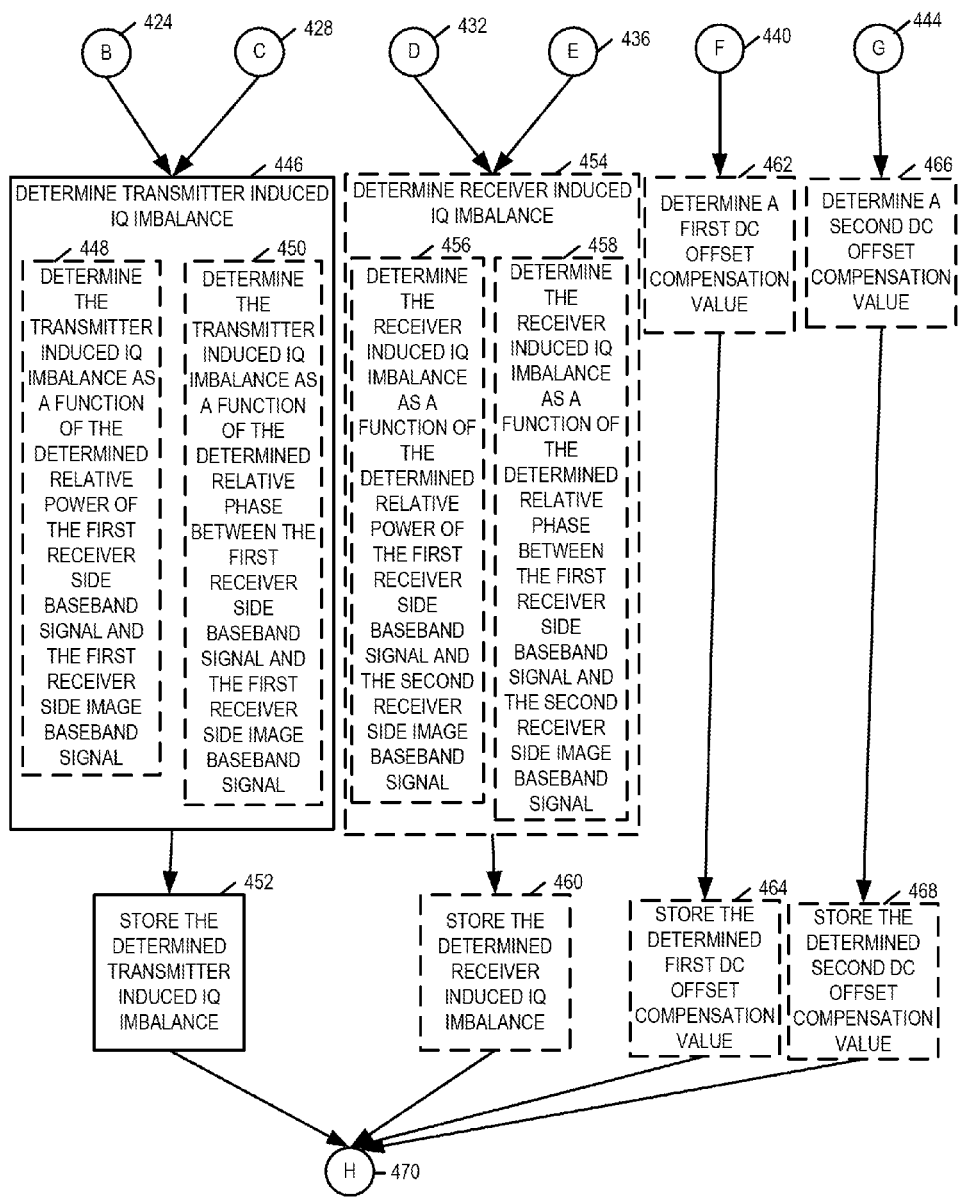
FIG. 4B is a second part of a flowchart of an exemplary method of operating a wireless communications device in accordance with various exemplary embodiments.
Figures 4, 4A, 4B, 4C:
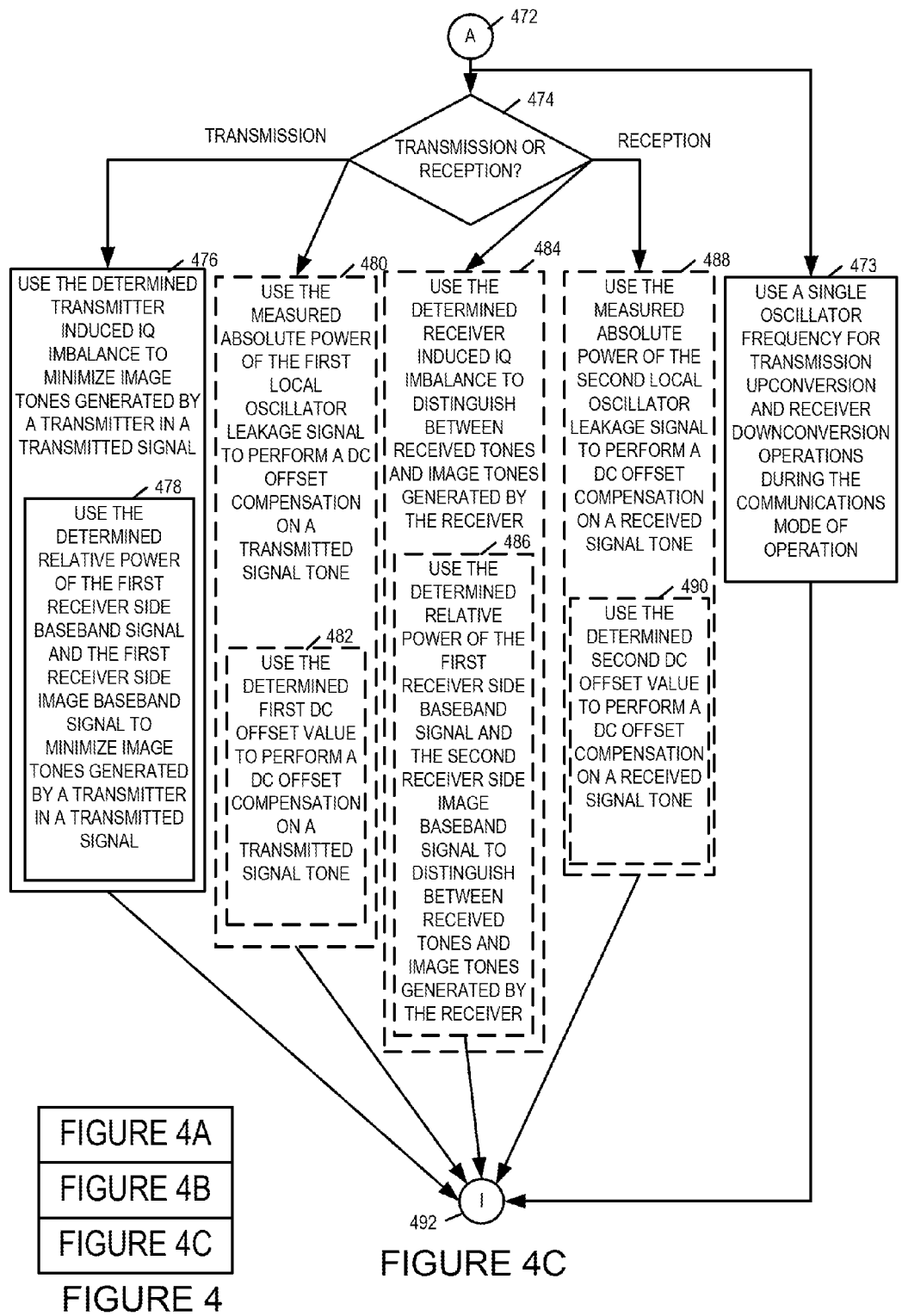
FIG. 4C is a third part of a flowchart of an exemplary method of operating a wireless communications device in accordance with various exemplary embodiments.

FIG. 4, comprising the combination of FIG. 4A, FIG. 4B and FIG. 4C, is a flowchart 400 of an exemplary method of operating a wireless communications device, e.g., a peer to peer mobile node, in accordance with various exemplary embodiments. The exemplary wireless communications device is, e.g., any of the wireless communications devices of peer to peer wireless communications system 100 of FIG. 1. One or more of the steps in flowchart 400, indicated by dashed lines, are included in some embodiments, while omitted in other embodiments. The exemplary method of flowchart 400 includes determining transmitter induced IQ imbalance information. In some embodiments, the exemplary method of flowchart 400 also includes one or more of: determining receiver induced IQ imbalance information, determining a first DC offset compensation, and determining a second DC offset compensation. The exemplary method of flowchart 400 will be described for an embodiment including each of the dashed line steps. However, in an embodiment, in which one or more dashed line steps are omitted, the step or steps to be omitted are bypassed.

Operation of the exemplary method starts in step 402, where the wireless communications device is powered on and initialized. Operation proceeds from start step 402 to step 404. In step 404 the wireless communications device determines whether the current mode of operation is a calibration mode of operation or a communications mode of operation. If the current mode of operation is calibration mode, then operation proceeds from step 404 to step 406; however, if the current mode of operation is a communications mode of operation, then operation proceeds from step 404 to step 408.

Returning to step 406, in step 406 the wireless communications device configures to use a different oscillator frequency for transmission upconversion and receiver downconversion operations during the calibration mode of operation. Operation proceeds from step 406 to step 410. In step 410 the wireless communications device performs an upconversion operation on a first baseband signal using a first oscillator signal to generate a transmit signal. Then, in step 412, the wireless communications device receives, via a feedback loop, the generated transmit signal. Operation proceeds from step 412 to step 414.

In step 414 the wireless communications device performs a downconversion operation on the received transmit signal using a second oscillator signal, said second oscillator signal being different in frequency from said first oscillator signal, and the downconversion operation produces a first receiver side baseband signal and a first receiver side image baseband signal. Step 414 includes sub-steps 416, 418, and 420. In sub-step 416 the downconversion operation also produces a second receiver side image baseband signal. In sub-step 418 the downconversion operation also produces a first local oscillator leakage signal. In sub-step 420 the downconversion operation produces a second local oscillator leakage signal. Operation proceeds from step 414 to steps 422, 426, 430, 434, 438, and 442.

In step 422 the wireless communications device determines a relative power of the first receiver side baseband signal and the first receiver side image baseband signal. Operation proceeds from step 422 via connecting node B 424 to step 446.

Returning to step 426, in step 426 the wireless communications device determines a relative phase between the receiver side baseband signal and the first receiver side image baseband signal. Operation proceeds from step 426 via connecting node C 428 to step 446.

Returning to step 430, in step 430 the wireless communications device determines a relative power of the first receiver side baseband signal and the second receiver side image baseband signal. Operation proceeds from step 430 via connecting node D 432 to step 454.

Returning to step 434, in step 434 the wireless communications device determines a relative phase between the receiver side baseband signal and the second receiver side image baseband signal. Operation proceeds from step 434 via connecting node E 436 to step 454.

Returning to step 438, in step 438 the wireless communications device measures the absolute power of the first local oscillator leakage signal. Operation proceeds from step 438 via connecting node F 440 to step 462.

Returning to step 442, in step 442 the wireless communications device measures the absolute power of the second local oscillator leakage signal. Operation proceeds from step 442 via connecting node G 444 to step 466.

Returning to step 446, in step 446 the wireless communications device determines transmitter induced IQ imbalance. In various embodiments step 446 includes one or more of sub-steps 448 and 450. In sub-step 448 the wireless communications device determines the transmitter induced IQ imbalance as a function of the determined relative power of the first receiver side baseband signal and first receiver side image baseband signal. In sub-step 450, the wireless communications device determines the transmitter induced IQ imbalance as a function of the determined relative phase between the first receiver side baseband signal and the first receiver side image baseband signal. Operation proceeds from step 446 to step 452, in which the wireless communications device stores the determined transmitter induced IQ imbalance.

Returning to step 454, in step 454 the wireless communications device determines receiver induced IQ imbalance. In various embodiments, step 454 includes one or more of sub-steps 456 and 458. In sub-step 456 the wireless communications device determines the receiver induced IQ imbalance as a function of the determined relative power of the first receiver side baseband signal and the second receiver side image baseband signal. In sub-step 458 the wireless communications device determines the receiver induced IQ imbalance as a function of the determined relative phase between the first receiver side baseband signal and the second receiver side image baseband signal. Operation proceeds from step 454 to step 460 in which the wireless communications device stores the determined receiver induced IQ imbalance.

Returning to step 462, in step 462 the wireless communications device determines a first DC offset compensation value as a function of the measured absolute power of the first local oscillator leakage signal. Operation proceeds from step 462 to step 464, in which the wireless communications device stores the determined first DC offset compensation value.

Returning to step 466, in step 466 the wireless communications device determines a second DC offset compensation value as a function of the measured absolute power of the second local oscillator leakage signal. Operation proceeds from step 466 to step 468, in which the wireless communications device stores the determined second DC offset compensation value. Operation proceeds from steps 452, 460, 464 and 468 via connecting node H 470 to the input of step 404.

Returning to step 408, in step 408 the wireless communications device configures to use a single oscillator frequency for transmission upconversion and receiver downconversion operations during the communications mode of operation.

Operation proceeds from step 408 via connecting node A 472 to steps 473 and 474. In step 473 the wireless communications device uses a single oscillator frequency for transmission upconversion and downconversion operations during the communications mode of operation, e.g., in accordance with the configuration of step 408. Operation proceeds from step 473 to connecting node I 492.

Returning to step 474, in step 474 the wireless communications device determines if it is to perform transmission or reception operations. If it is to perform transmission operations, then operation proceeds from step 474 to steps 476 and 480. However, if it is to perform reception operations, then operation proceeds from step 474 to step 484 and step 488.

Returning to step 476, in step 476 the wireless communications device uses the determined transmitter induced IQ imbalance to minimize image tones generated by a transmitter in a transmitted signal. Step 476 includes sub-step 478 in which the wireless communications device uses the determined relative power of the first receiver side baseband signal and the first receiver side image baseband signal to minimize image tones generated by a transmitter in a transmitted signal.

Returning to step 480, in step 480 the wireless communications device uses the measured absolute power of the first local oscillator leakage signal to perform a DC offset compensation on a transmitted signal tone. Step 480 includes sub-step 482 in which the wireless communications device uses the determined first DC offset value to perform a DC offset compensation on a transmitted signal tone.

Returning to step 484, in step 484 the wireless communications device uses the determined receiver induced IQ imbalance to distinguish between received tones and image tones generated by the receiver. Step 484 includes sub-step 486 in which the wireless communications device uses the determined relative power of the first receiver side baseband signal and the second receiver side image baseband signal to distinguish between received tones and image tones generated by the receiver.

Returning to step 488, in step 488 the wireless communications device uses the measured absolute power of the second local oscillator leakage signal to perform a DC offset compensation on a received signal tone. Step 488 includes sub-step 490 in which the wireless communications device uses the determined second DC offset value to perform a DC offset compensation on a received signal tone. Operation proceeds from steps 476, 480, 484 and 488, via connecting node I 492 to step 404.

In various embodiments, the upconversion and downconversion operations are direct upconversion and direct downconversion operations. In various embodiments, the relative power of the first receiver side baseband signal and the first receiver side image baseband signal is used to determine transmitter induced IQ imbalance and the relative power of the first receiver side baseband signal and the second receiver side image baseband signal is used to determine the receiver induced IQ imbalance. In some, but not necessarily all embodiments, the transmitter induced IQ imbalance is determined as a function of both (i) the determined relative power of the first receiver side baseband signal and the first receiver side image baseband signal and (ii) the determined relative phase between the first receiver side baseband signal and the first receiver side image baseband signal. In some, but not necessarily all embodiments, the receiver induced IQ imbalance is determined as a function of both (i) the determined relative power of the first receiver side baseband signal and the second receiver side image baseband signal and (ii) the determined relative phase between the first receiver side baseband signal and the second receiver side image baseband signal.

In one exemplary embodiment, the first baseband signal is a signal at f; the first oscillator frequency is fc(Tx); the second oscillator frequency is fc(Rx), the first receiver side baseband signal is a signal at fc(Tx)+f−fc(Rx); the first receiver side image baseband signal is a signal at fc(Tx)−f−fc(Rx); the second receiver side image baseband signal is a signal at fc(Rx)−(fc(Tx)+f); the first local oscillator leakage signal is a signal at frequency fc(Tx)−fc(Rx); and the second local oscillator leakage signal is a signal at fc(Rx)−fc(Rx).

The calibration described in FIG. 4 corresponding to first baseband signal, e.g., a single tone signal at frequency f, in some embodiments, is repeated at different times for each of a plurality of tones, e.g., for each tone in the set of tones in the baseband. In some embodiments, the set of tones used for calibration is the full set of tones in the baseband, e.g., with a calibration corresponding to each different tone being performed at a different time. Thus, in some embodiments, a set of: (i) RX IQ imbalance compensation information, (ii) TX IQ imbalance compensation information, (iii) RX DC offset compensation information, and (iv) TX DC offset compensation information is determined for each tone of the baseband. In some embodiments, a calibration set of compensation information corresponding to a baseband tone is used for a set of adjacent baseband tones.

In some embodiments, the set of tones used as input for calibration includes the set of tones on one side, e.g., a first side, of the center tone of the baseband. In some such embodiments calibration information corresponding to the other side, e.g., the second side, of the center tone of the baseband is determined as a function of the determined calibration information corresponding to the first side.

In some embodiments, a single pass of the calibration operation includes more than one tone in the first baseband signal of step 410, e.g., with the tones used in the multi-tone signal being sufficiently spaced such that the signals, used in determining the RX IQ imbalance and TX IQ imbalance corresponding to different input tones, do not interfere with one another.

Thus in various embodiments, different sets of: RX IQ compensation information, TX IQ compensation information, TX DC offset compensation information, and RX DC offset compensation information, are obtained and stored corresponding to different baseband tones. In such an embodiment, when the wireless terminal is operating in a communications mode, the wireless terminal selects and uses the stored set of compensation information corresponding to the tone of interest being used, e.g., the tone used to carry a signal being transmitted or received.

Figure 5:
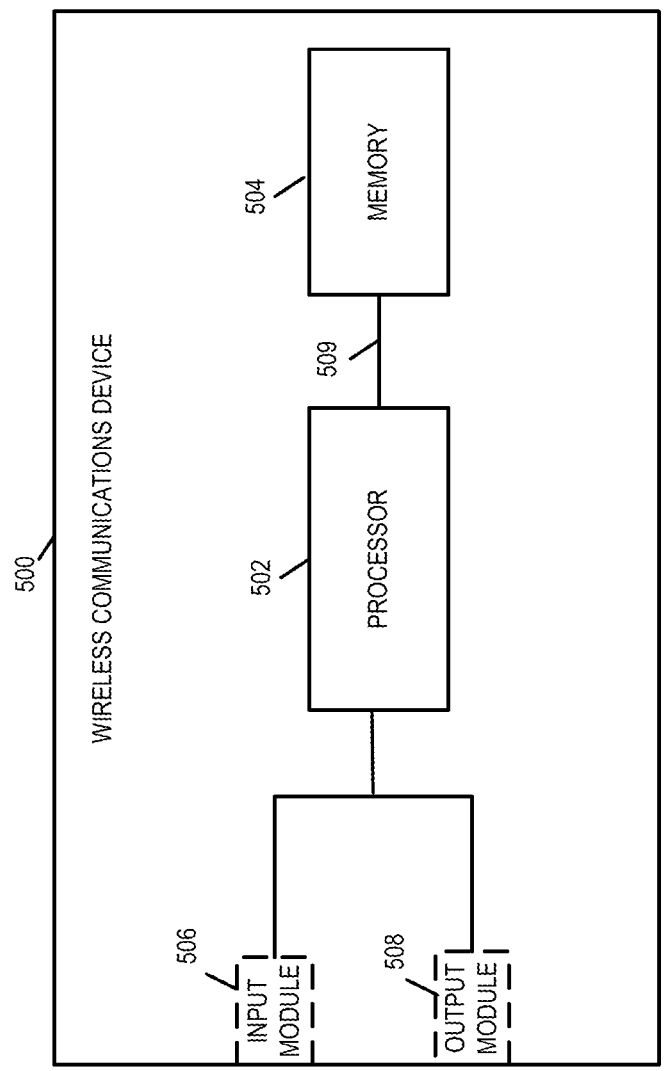
FIG. 5 is a drawing of an exemplary wireless communications device, in accordance with an exemplary embodiment.

FIG. 5 is a drawing of an exemplary wireless communications device 500, in accordance with an exemplary embodiment. Exemplary wireless communications device 500 is, e.g., one of the wireless communications devices of FIG. 1. Exemplary wireless communications device 500 may, and sometimes does, implement a method in accordance with flowchart 400 of FIG. 4.

Wireless communications device 500 includes a processor 502 and memory 504 coupled together via a bus 509 over which the various elements (502, 504) may interchange data and information. Communications device 500 further includes an input module 506 and an output module 508 which may be coupled to processor 502 as shown. However, in some embodiments, the input module 506 and output module 508 are located internal to the processor 502. Input module 506 can receive input signals. Input module 506 can, and in some embodiments does, include a wireless receiver and/or a wired or optical input interface for receiving input. Output module 508 may include, and in some embodiments does include, a wireless transmitter and/or a wired or optical output interface for transmitting output.

Processor 502 is configured to perform an upconversion operation on a first baseband signal using a first oscillator signal to generate a transmit signal; receive via a feedback loop the generated transmit signal; perform a downconversion operation on the received transmit signal using a second oscillator signal, said second oscillator signal being different in frequency from said first oscillator signal, said downconversion operation producing a first receiver side baseband signal and a first receiver side image baseband signal; and determine a relative power of the first receiver side baseband signal and first receiver side image baseband signal.

In some embodiments, the downconversion operation further produces a second receiver side image baseband signal, and processor 502 is further configured to determine the relative power of the first receiver side baseband signal and second receiver side image baseband signal.

In various embodiments, processor 502 is configured to: use the determined relative power of the first receiver side baseband signal and second receiver side image baseband signal to distinguish between received tones and image tones generated by the receiver, e.g., during a communications mode of operation following the calibration mode of operation. In various embodiments, processor 502 is configured to use the determined relative power of the first receiver side image signal and the first receiver side image baseband signal to control transmission to minimize image tones generated by a transmitter in a transmitted signal, e.g., during a communications mode of operation following the calibration mode of operation.

In some embodiments, processor 502 is configured to: determine transmitter induced IQ imbalance as a function of the relative power of the first receiver side baseband signal and the first receiver side image baseband signal. In some such embodiments, processor 502 is further configured to: determine a relative phase between the first receiver side baseband signal and first receiver side image baseband signal, and said determining transmitter IQ imbalance is also determined as a function of said determined relative phase.

In some embodiments, processor 502 is configured to determine receiver induced IQ imbalance as a function of the relative power of the first receiver side baseband signal and the second receiver side image baseband signal. In some such embodiments, processor 502 is further configured to: determine a relative phase between the first receiver side baseband signal and second receiver side image baseband signal, and said determining receiver IQ imbalance is also determined as a function of said determined relative phase.

In various embodiments, processor 502 is configured to use the relative power of the first receiver side baseband signal and the first receiver side image baseband signal to determine transmitter introduced IQ imbalance; and processor 502 is configured to use the relative power of the first receiver side baseband signal and the second receiver side image baseband signal to determine the receiver introduced IQ imbalance.

In some embodiments, the downconversion operation further produces a first local oscillator leakage signal, and processor 502 is configured to: measure the absolute power of the first local oscillator leakage signal; and use said measured absolute power to perform a DC offset compensation operation on a transmitted signal tone during a data transmission time period following said measurement of the absolute power of the first local oscillator leakage signal.

In some embodiments, the downconversion operation further produces a second local oscillator leakage signal, and wherein processor 502 is further configured to: measure the absolute power of the second local oscillator leakage signal; and use said measured absolute power to perform a DC offset compensation operation on a received signal tone during the data reception time period following said measurement of the absolute power of the second local oscillator leakage signal.

In some embodiments, the upconversion and downconversion operations are direct upconversion and direct downconversion operations. In various embodiments, the upconversion and downconversion operations producing the first receiver side baseband signal and the first receiver side image baseband signal are performed during a calibration mode of operation, e.g., processor 502 is configured to operate in a calibration mode of operation when performing those operations. In various embodiments, processor 502 is further configured to use a single oscillator frequency for transmission upconversion and receiver downconversion operations during a communications mode of operation.

Figure 6A:
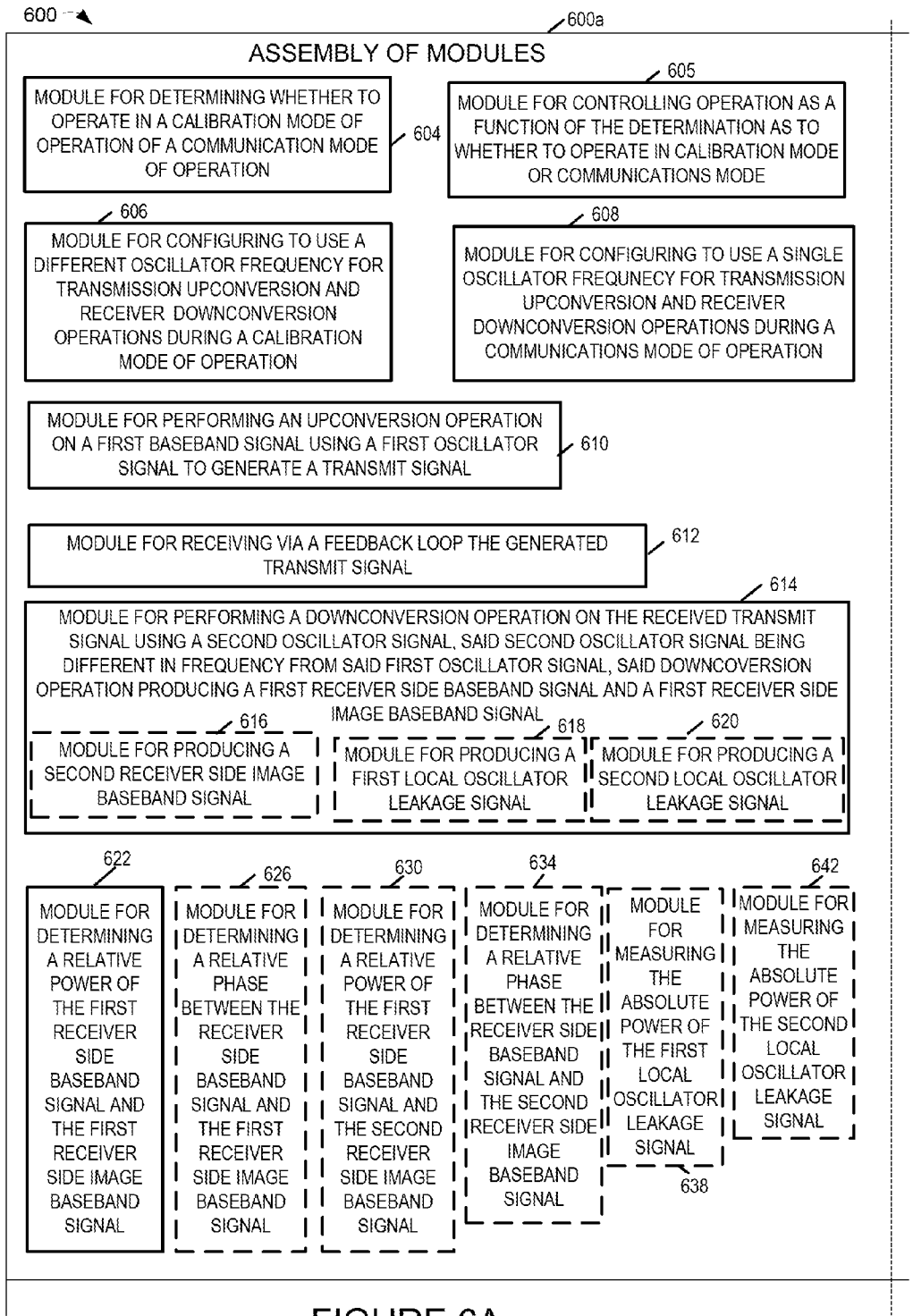
FIG. 6A is a first portion of an assembly of modules which can, and in some embodiments is, used in the wireless communications device illustrated in FIG. 5.
Figures 6, 6B:
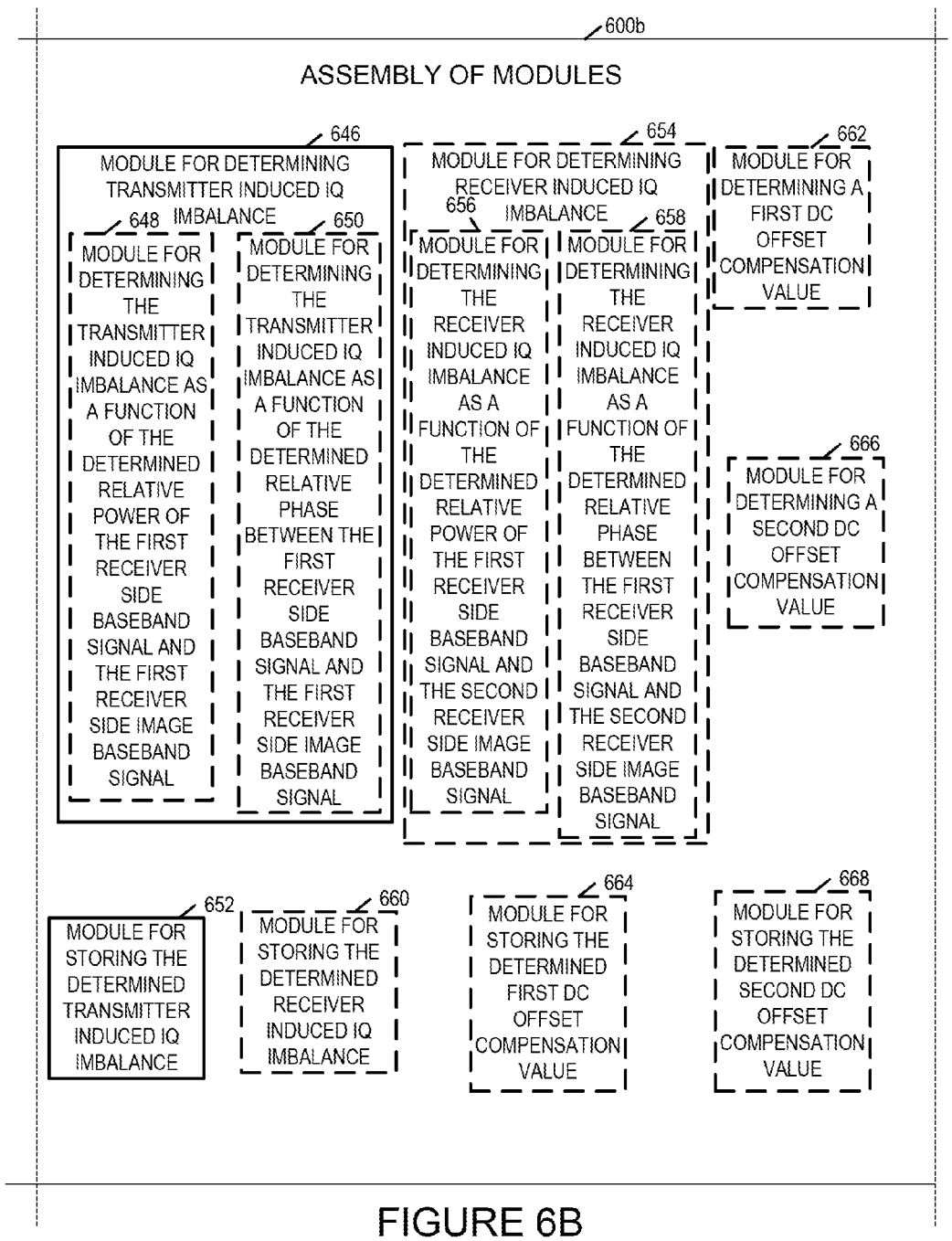
FIG. 6B is a second portion of an assembly of modules which can, and in some embodiments is, used in the wireless communications device illustrated in FIG. 5.
Figure 6C:
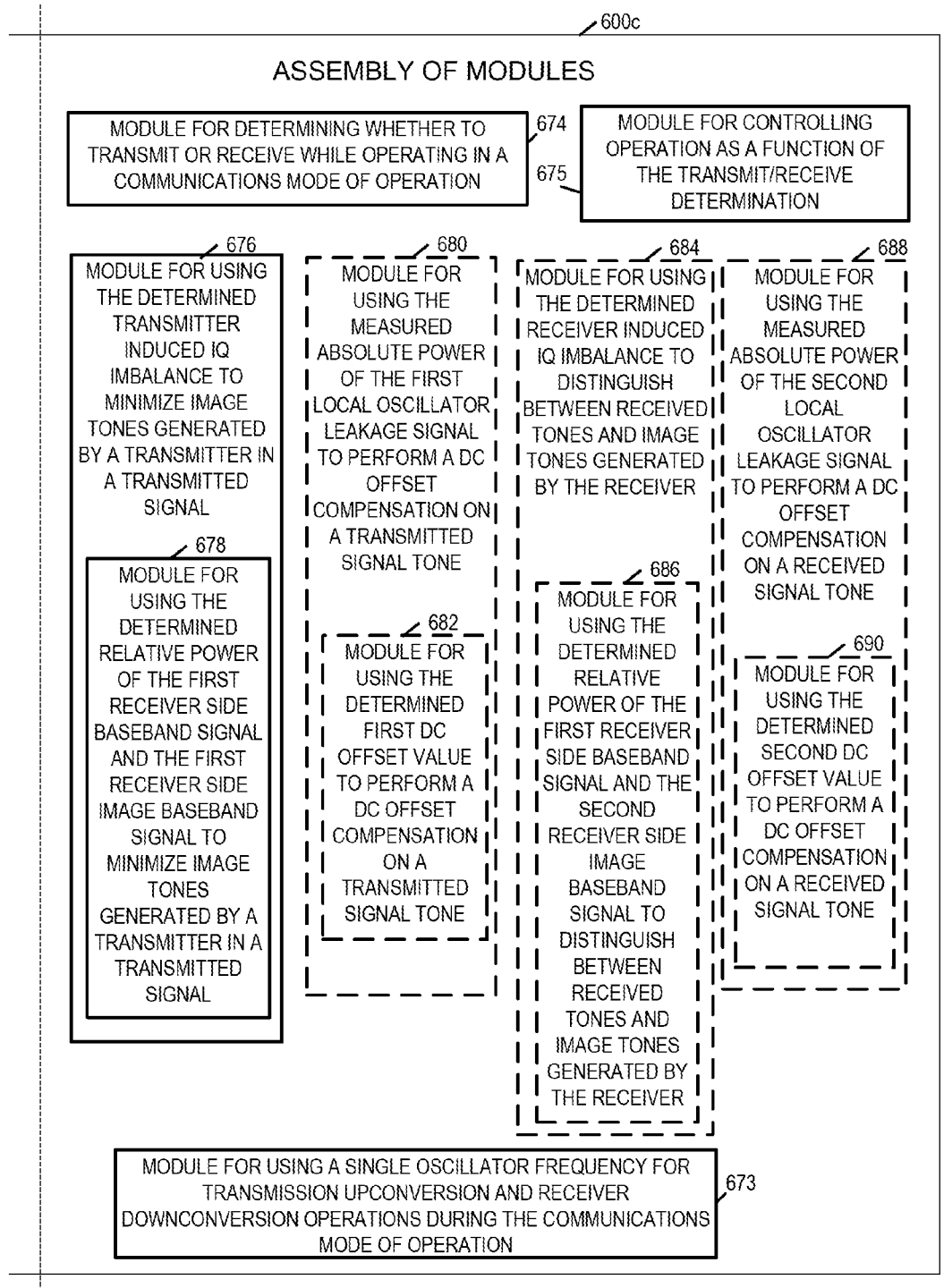
FIG. 6C is a third portion of an assembly of modules which can, and in some embodiments is, used in the wireless communications device illustrated in FIG. 5.

FIG. 6, comprising the combination of FIG. 6A, FIG. 6B and FIG. 6C is an assembly of modules 600 which can, and in some embodiments is, used in the wireless communications device 500 illustrated in FIG. 5. Assembly of modules 600 includes portion 600a, potion 600b and portion 600c. The modules in the assembly 600 can be implemented in hardware within the processor 502 of FIG. 5, e.g., as individual circuits. Alternatively, the modules may be implemented in software and stored in the memory 504 of the communications device 500 shown in FIG. 5. While shown in the FIG. 5 embodiment as a single processor, e.g., computer, it should be appreciated that the processor 502 may be implemented as one or more processors, e.g., computers. When implemented in software the modules include code, which when executed by the processor, configure the processor, e.g., computer, 502 to implement the function corresponding to the module. In some embodiments, processor 502 is configured to implement each of the modules of the assembly of modules 600. In embodiments where the assembly of modules 600 is stored in the memory 504, the memory 504 is a computer program product comprising a computer readable medium comprising code, e.g., individual code for each module, for causing at least one computer, e.g., processor 502, to implement the functions to which the modules correspond.

Completely hardware based or completely software based modules may be used. However, it should be appreciated that any combination of software and hardware (e.g., circuit implemented) modules may be used to implement the functions. As should be appreciated, the modules illustrated in FIG. 6 control and/or configure the communications device 500 or elements therein such as the processor 502, to perform the functions of the corresponding steps illustrated and/or described in the method of flowchart 400 of FIG. 4.

Assembly of modules 600 includes a module 604 for determining whether to operate in a calibration mode of operation or a communications mode of operation, a module 605 for controlling operation as a function of the determination as to whether to operate in the calibration mode of operation of the communications mode of operation, a module 606 for configuring to use a different oscillator frequency for transmission upconversions and receiver downconversion operations during a calibration mode of operation, and a module 608 for configuring to use a single oscillator frequency for transmission upconversion and receiver downconversion operations during a communications mode of operation. Assembly of moduleS 600 further includes a module 610 for performing an upconversion operation on a first baseband signal using a first oscillator signal to generate a transmit signal, a module 612 for receiving, via feedback loop, the generated transmit signal from module 610, and a module 614 for performing a downconversion operation on the received transmit signal using a second oscillator signal, said second oscillator signal being different in frequency from said first oscillator signal, said downconversion operation producing a first receiver side baseband signal and a first receiver side image baseband signal. Module 614 for performing a downconversion operation further includes a module 616 for producing a second receiver side image baseband signal, a module 618 for producing a first local oscillator leakage signal, and a module 620 for producing a second local oscillator leakage signal.

Assembly of modules 600 further includes a module 622 for determining a relative power of the first receiver side baseband signal and the first receiver side image baseband signal, a module 626 for determining a relative phase between the receiver side baseband signal and the first receiver side image baseband signal, a module 630 for determining a relative power of the first receiver side baseband signal and the second receiver side image baseband signal, a module 634 for determining a relative phase between the receiver side baseband signal and the second receiver side image baseband signal, a module 638 for measuring the absolute power of the first local oscillator leakage signal and a module 642 for measuring the absolute power of the second local oscillator leakage signal. Assembly of modules 600 further includes a module 646 for determining transmitter induced IQ imbalance, a module 654 for determining receiver induced IQ imbalance, a module 662 for determining a first DC offset compensation value as a function of the measured absolute power of the first local oscillator leakage signal, a module 666 for determining a second DC offset compensation value as a function of the measured absolute power of the second local oscillator leakage signal, a module 652 for storing the determined transmitter induced IQ imbalance, a module 660 for storing the determined receiver induced IQ imbalance, a module 664 for storing the determined first DC offset compensation value, and a module 668 for storing the determined second DC offset compensation value. In various embodiments, module 646 includes one or more of: a module 648 for determining the transmitter induced IQ imbalance as a function of the determined relative power of the first receiver side baseband signal and the first receiver side image baseband signal and a module 650 for determining the transmitter induced IQ imbalance as a function of the determined relative phase between the first receiver side baseband signal and the first receiver side image baseband signal. In some embodiments, modules 648 and 650 work together to determine to the transmitter induced IQ imbalance. In various embodiments, module 654 includes one or more of: a module 656 for determining the receiver induced IQ imbalance as a function of the determined relative power of the first receiver side baseband signal and the second receiver side image baseband signal and a module 658 for determining the receiver induced IQ imbalance as a function of the determined relative phase between the first receiver side baseband signal and the second receiver side image baseband signal. In some embodiments modules 656 and 658 work together to determine the receiver induced IQ imbalance.

Assembly of modules 600 further includes a module 673 for using a single oscillator frequency for transmission upconversion and receiver downconversion operations during a communications mode of operation, a module 674 for determining whether to transmit or receive while operating in a communications mode of operation, a module 675 for controlling operation as a function of the transmit/receive determination of module 674, a module 676 for using the determined transmitter induced IQ imbalance to minimize image tones generated by a transmitter in a transmitted signal, a module 680 for using the measured absolute power of the first local oscillator leakage signal to perform a DC offset compensation on a transmitted signal tone, a module 684 for using the determined receiver induced IQ imbalance to distinguish between received tones and image tones generated by the receiver, and a module 688 for using the measured absolute power of the second local oscillator leakage signal to perform a DC offset compensation on a received signal tone. Module 676 includes a module 678 for using the determined relative power of the first receiver side baseband signal and the first receiver side image baseband signal to minimize image tones generated by a transmitter in a transmitted signal. Module 680 includes a module 682 for using the determined first DC offset compensation value to perform a DC offset compensation on a transmitted signal tone. Module 684 includes a module 686 for using the determined relative power of the first receiver side baseband signal and second receiver side image baseband signal to distinguish between received tones and image tones generated by a receiver. Module 688 includes a module 690 for using the determined second DC offset value to perform a DC offset compensation on a received signal tone.

In one exemplary embodiment, the first baseband signal is a signal at f; the first oscillator frequency is fc(Tx); the second oscillator frequency is fc(Rx), the first receiver side baseband signal is a signal at fc(Tx)+f−fc(Rx); the first receiver side image baseband signal is a signal at fc(Tx)−f−fc(Rx); the second receiver side image baseband signal is a signal at fc(Rx)−(fc(Tx)+f); the first local oscillator leakage signal is a signal at frequency fc(Tx)−fc(Rx); and the second local oscillator leakage signal is a signal at fc(Rx)−fc(Rx).

Figure 7B:
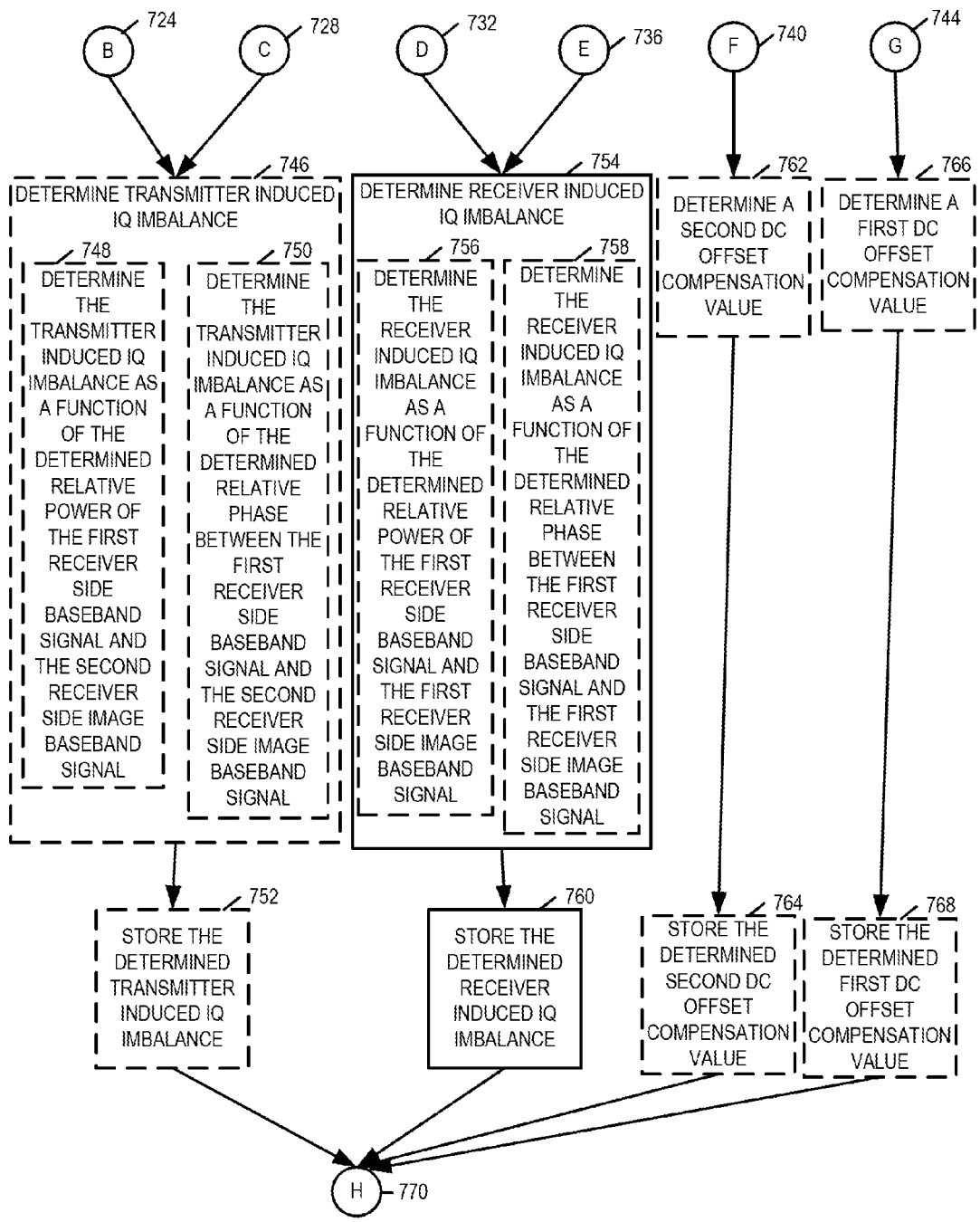
FIG. 7B is a second part of a flowchart of an exemplary method of operating a wireless communications device in accordance with various exemplary embodiments.
Figure 7C:
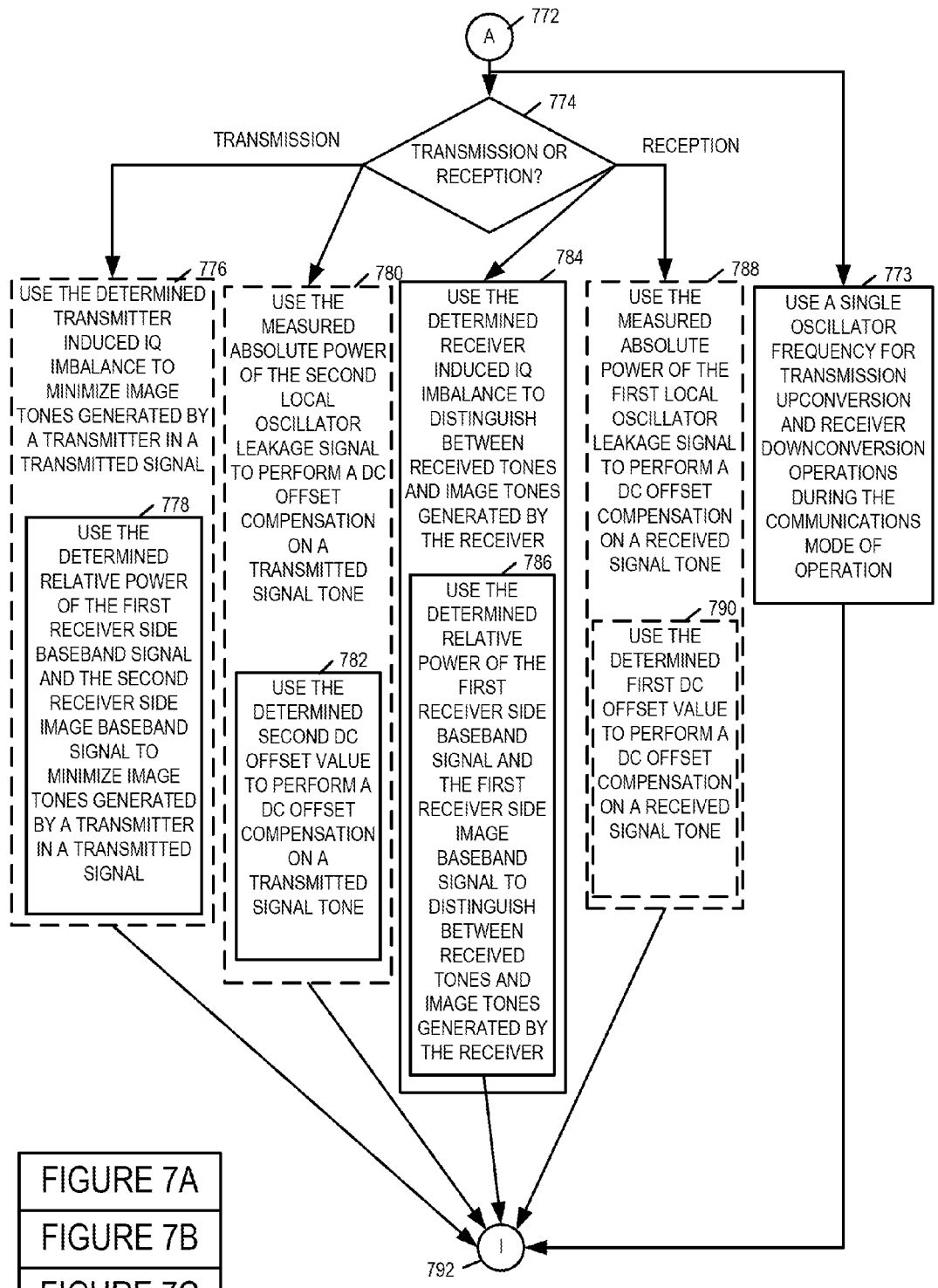
FIG. 7C is a third part of a flowchart of an exemplary method of operating a wireless communications device in accordance with various exemplary embodiments.

FIG. 7, comprising the combination of FIG. 7A, FIG. 7B and FIG. 7C, is a flowchart 700 of an exemplary method of operating a wireless communications device, e.g., a peer to peer mobile node, in accordance with various exemplary embodiments. The exemplary wireless communications device is, e.g., any of the wireless communications devices of peer to peer wireless communications system 100 of FIG. 1. One or more of the steps in flowchart 700, indicated by dashed lines, are included in some embodiments, while omitted in other embodiments. The exemplary method of flowchart 700 includes determining receiver induced IQ imbalance information. In some embodiments, the exemplary method of flowchart 700 also includes one or more of: determining transmitter induced IQ imbalance information, determining a first DC offset compensation, and determining a second DC offset compensation. The exemplary method of flowchart 700 will be described for an embodiment including each of the dashed line steps. However, in an embodiment, in which one or more dashed line steps are omitted, the step or steps to be omitted are bypassed.

Operation of the exemplary method starts in step 702, where the wireless communications device is powered on and initialized. Operation proceeds from start step 702 to step 704. In step 704 the wireless communications device determines whether the current mode of operation is a calibration mode of operation or a communications mode of operation. If the current mode of operation is calibration mode, then operation proceeds from step 704 to step 706; however, if the current mode of operation is a communications mode of operation, then operation proceeds from step 704 to step 708.

Returning to step 706, in step 706 the wireless communications device configures to use a different oscillator frequency for transmission upconversion and receiver downconversion operations during the calibration mode of operation. Operation proceeds from step 706 to step 710. In step 710 the wireless communications device performs an upconversion operation on a first baseband signal using a first oscillator signal to generate a transmit signal. Then, in step 712, the wireless communications device receives, via a feedback loop, the generated transmit signal. Operation proceeds from step 712 to step 714.

In step 714 the wireless communications device performs a downconversion operation on the received transmit signal using a second oscillator signal, said second oscillator signal being different in frequency from said first oscillator signal, and the downconversion operation produces a first receiver side baseband signal and a first receiver side image baseband signal. Step 714 includes sub-steps 716, 718, and 720. In sub-step 716 the downconversion operation also produces a second receiver side image baseband signal. In sub-step 718 the downconversion operation also produces a first local oscillator leakage signal. In sub-step 720 the downconversion operation produces a second local oscillator leakage signal. Operation proceeds from step 714 to steps 722, 726, 730, 734, 738, and 742.

In step 722 the wireless communications device determines a relative power of the first receiver side baseband signal and the second receiver side image baseband signal. Operation proceeds from step 722 via connecting node B 724 to step 746.

Returning to step 726, in step 726 the wireless communications device determines a relative phase between the receiver side baseband signal and the second receiver side image baseband signal. Operation proceeds from step 726 via connecting node C 728 to step 746.

Returning to step 730, in step 730 the wireless communications device determines a relative power of the first receiver side baseband signal and the first receiver side image baseband signal. Operation proceeds from step 730 via connecting node D 732 to step 754.

Returning to step 734, in step 734 the wireless communications device determines a relative phase between the receiver side baseband signal and the first receiver side image baseband signal. Operation proceeds from step 734 via connecting node E 736 to step 754.

Returning to step 738, in step 738 the wireless communications device measures the absolute power of the second local oscillator leakage signal. Operation proceeds from step 738 via connecting node F 740 to step 762.

Returning to step 742, in step 742 the wireless communications device measures the absolute power of the second local oscillator leakage signal. Operation proceeds from step 742 via connecting node G 744 to step 766.

Returning to step 746, in step 746 the wireless communications device determines transmitter induced IQ imbalance. In various embodiments step 746 includes one or more of sub-steps 748 and 750. In sub-step 748 the wireless communications device determines the transmitter induced IQ imbalance as a function of the determined relative power of the first receiver side baseband signal and the second receiver side image baseband signal. In sub-step 750, the wireless communications device determines the transmitter induced IQ imbalance as a function of the determined relative phase between the first receiver side baseband signal and the second receiver side image baseband signal. Operation proceeds from step 746 to step 752, in which the wireless communications device stores the determined transmitter induced IQ imbalance.

Returning to step 754, in step 754 the wireless communications device determines receiver induced IQ imbalance. In various embodiments, step 754 includes one or more of sub-steps 756 and 758. In sub-step 756 the wireless communications device determines the receiver induced IQ imbalance as a function of the determined relative power of the first receiver side baseband signal and the first receiver side image baseband signal. In sub-step 758 the wireless communications device determines the receiver induced IQ imbalance as a function of the determined relative phase between the first receiver side baseband signal and the first receiver side image baseband signal. Operation proceeds from step 754 to step 760 in which the wireless communications device stores the determined receiver induced IQ imbalance.

Returning to step 762, in step 762 the wireless communications device determines a second DC offset compensation value as a function of the measured absolute power of the second local oscillator leakage signal. Operation proceeds from step 762 to step 764, in which the wireless communications device stores the determined second DC offset compensation value.

Returning to step 766, in step 766 the wireless communications device determines a first DC offset compensation value as a function of the measured absolute power of the first local oscillator leakage signal. Operation proceeds from step 766 to step 768, in which the wireless communications device stores the determined first DC offset compensation value. Operation proceeds from steps 752, 760, 764 and 768 via connecting node H 770 to the input of step 704.

Returning to step 708, in step 708 the wireless communications device configures to use a single oscillator frequency for transmission upconversion and receiver downconversion operations during the communications mode of operation. Operation proceeds from step 708 via connecting node A 772 to steps 773 and 774. In step 773 the wireless communications device uses a single oscillator frequency for transmission upconversion and downconversion operations during the communications mode of operation, e.g., in accordance with the configuration of step 708. Operation proceeds from step 773 to connecting node I 792.

Returning to step 774, in step 774 the wireless communications device determines if it is to perform transmission or reception operations. If it is to perform transmission operations, then operation proceeds from step 774 to steps 776 and 780. However, if it is to perform reception operations, then operation proceeds from step 774 to step 784 and step 788.

Returning to step 776, in step 776 the wireless communications device uses the determined transmitter induced IQ imbalance to minimize image tones generated by a transmitter in a transmitted signal. Step 776 includes sub-step 778 in which the wireless communications device uses the determined relative power of the first receiver side baseband signal and the second receiver side image baseband signal to minimize image tones generated by a transmitter in a transmitted signal.

Returning to step 780, in step 780 the wireless communications device uses the measured absolute power of the second local oscillator leakage signal to perform a DC offset compensation on a transmitted signal tone. Step 780 includes sub-step 782 in which the wireless communications device uses the determined second DC offset value to perform a DC offset compensation on a transmitted signal tone.

Returning to step 784, in step 784 the wireless communications device uses the determined receiver induced IQ imbalance to distinguish between received tones and image tones generated by the receiver. Step 784 includes sub-step 786 in which the wireless communications device uses the determined relative power of the first receiver side baseband signal and the first receiver side image baseband signal to distinguish between received tones and image tones generated by the receiver.

Returning to step 788, in step 788 the wireless communications device uses the measured absolute power of the first local oscillator leakage signal to perform a DC offset compensation on a received signal tone. Step 788 includes substep 790 in which the wireless communications device uses the determined first DC offset value to perform a DC offset compensation on a received signal tone. Operation proceeds from steps 776, 780, 784 and 788, via connecting node I 792 to step 704.

In various embodiments, the upconversion and downconversion operations are direct upconversion and direct downconversion operations. In various embodiments, the relative power of the first receiver side baseband signal and the first receiver side image baseband signal is used to determined receiver induced IQ imbalance and the relative power of the first receiver side baseband signal and the second receiver side image baseband signal is used to determine the transmitter induced IQ imbalance. In some, but not necessarily all embodiments, the receiver induced IQ imbalance is determined as a function of both (i) the determined relative power of the first receiver side baseband signal and the first receiver side image baseband signal and (ii) the determined relative phase between the first receiver side baseband signal and the first receiver side image baseband signal. In some, but not necessarily all embodiments, the transmitter induced IQ imbalance is determined as a function of both (i) the determined relative power of the first receiver side baseband signal and the second receiver side image baseband signal and (ii) the determined relative phase between the first receiver side baseband signal and the second receiver side image baseband signal.

In one exemplary embodiment, the first baseband signal is a signal at f; the first oscillator frequency is fc(Tx); the second oscillator frequency is fc(Rx), the first receiver side baseband signal is a signal at fc(Tx)+f−fc(Rx); the second receiver side image baseband signal is a signal at fc(Tx)−f−fc(Rx); the first receiver side image baseband signal is a signal at fc(Rx)−(fc(Tx)+f); the second local oscillator leakage signal is a signal at frequency fc(Tx)−fc(Rx); and the first local oscillator leakage signal is a signal at fc(Rx)−fc(Rx).

The calibration described in FIG. 7 corresponding to first baseband signal, e.g., a single tone signal at frequency f, in some embodiments, is repeated at different times for each of a plurality of tones, e.g., for each tone in the set of tones in the baseband. In some embodiments, the set of tones used for calibration is the full set of tones in the baseband, e.g., with a calibration corresponding to each different tone being performed at a different time. Thus, in some embodiments, a set of: (i) RX IQ imbalance compensation information, (ii) TX IQ imbalance compensation information, (iii) RX DC offset compensation information, and (iv) TX DC offset compensation information is determined for each tone of the baseband. In some embodiments, a calibration set of compensation information corresponding to a baseband tone is used for a set of adjacent baseband tones.

In some embodiments, the set of tones used as input for calibration includes the set of tones on one side, e.g., a first side, of the center tone of the baseband. In some such embodiments calibration information corresponding to the other side, e.g., the second side, of the center tone of the baseband is determined as a function of the determined calibration information corresponding to the first side.

In some embodiments, a single pass of the calibration operation includes more than one tone in the first baseband signal of step 410, e.g., with the tones used in the multi-tone signal being sufficiently spaced such that the signals, used in determining the RX IQ imbalance and TX IQ imbalance corresponding to different input tones do not interfere with one another.

Thus in various embodiments, different sets of: RX IQ compensation information, TX IQ compensation information, TX DC offset compensation information, and RX DC offset compensation information, are obtained and stored corresponding to different baseband tones. In such an embodiment, when the wireless terminal is operating in a communications mode, the wireless terminal selects and uses the stored set of compensation information corresponding to the tone of interest being used, e.g., the tone used to carry a signal being transmitted or received.

Figure 8:
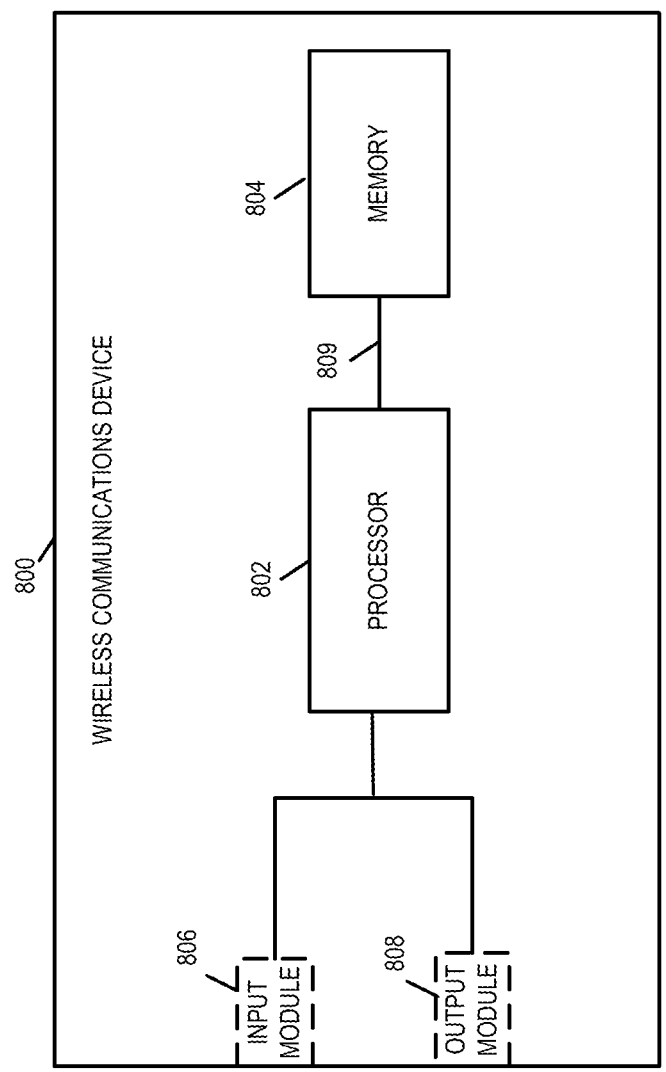
FIG. 8 is a drawing of an exemplary wireless communications device, in accordance with an exemplary embodiment.

FIG. 8 is a drawing of an exemplary wireless communications device 800, in accordance with an exemplary embodiment. Exemplary wireless communications device 800 is, e.g., one of the wireless communications devices of FIG. 1. Exemplary wireless communications device 800 may, and sometimes does, implement a method in accordance with flowchart 700 of FIG. 7.

Wireless communications device 800 includes a processor 802 and memory 804 coupled together via a bus 809 over which the various elements (802, 804) may interchange data and information. Communications device 800 further includes an input module 806 and an output module 808 which may be coupled to processor 802 as shown. However, in some embodiments, the input module 806 and output module 808 are located internal to the processor 802. Input module 806 can receive input signals. Input module 806 can, and in some embodiments does, include a wireless receiver and/or a wired or optical input interface for receiving input. Output module 808 may include, and in some embodiments does include, a wireless transmitter and/or a wired or optical output interface for transmitting output.

Processor 802 is configured to perform an upconversion operation on a first baseband signal using a first oscillator signal to generate a transmit signal; receive via a feedback loop the generated transmit signal; perform a downconversion operation on the received transmit signal using a second oscillator signal, said second oscillator signal being different in frequency from said first oscillator signal, said downconversion operation producing a first receiver side baseband signal and a first receiver side image baseband signal; and determine a relative power of the first receiver side baseband signal and first receiver side image baseband signal.

In some embodiments, the downconversion operation further produces a second receiver side image baseband signal, and processor 802 is further configured to determine the relative power of the first receiver side baseband signal and second receiver side image baseband signal.

In various embodiments, processor 802 is configured to: use the determined relative power of the first receiver side baseband signal and first receiver side image baseband signal to distinguish between received tones and image tones generated by the receiver, e.g., during a communications mode of operation following the calibration mode of operation. In various embodiments, processor 802 is configured to use the determined relative power of the first receiver side image signal and the second receiver side image baseband signal to control transmission to minimize image tones generated by a transmitter in a transmitted signal, e.g., during a communications mode of operation following the calibration mode of operation.

In some embodiments, processor 802 is configured to: determine receiver induced IQ imbalance as a function of the relative power of the first receiver side baseband signal and the first receiver side image baseband signal. In some such embodiments, processor 802 is further configured to: determine a relative phase between the first receiver side baseband signal and first receiver side image baseband signal, and said determining receiver IQ imbalance is also determined as a function of said determined relative phase.

In some embodiments, processor 802 is configured to determine transmitter induced IQ imbalance as a function of the relative power of the first receiver side baseband signal and the second receiver side image baseband signal. In some such embodiments, processor 802 is further configured to: determine a relative phase between the first receiver side baseband signal and second receiver side image baseband signal, and said determining transmitter IQ imbalance is also determined as a function of said determined relative phase.

In various embodiments, processor 802 is configured to use the relative power of the first receiver side baseband signal and the first receiver side image baseband signal to determine receiver introduced IQ imbalance; and processor 802 is configured to use the relative power of the first receiver side baseband signal and the second receiver side image baseband signal to determine the transmitter introduced IQ imbalance.

In some embodiments, the downconversion operation further produces a first local oscillator leakage signal, and wherein processor 802 is further configured to: measure the absolute power of the first local oscillator leakage signal; and use said measured absolute power to perform a DC offset compensation operation on a received signal tone during the data reception time period following said measurement of the absolute power of the first local oscillator leakage signal.

In some embodiments, the downconversion operation further produces a second local oscillator leakage signal, and processor 802 is configured to: measure the absolute power of the second local oscillator leakage signal; and use said measured absolute power to perform a DC offset compensation operation on a transmitted signal tone during a data transmission time period following said measurement of the absolute power of the second local oscillator leakage signal.

In some embodiments, the upconversion and downconversion operations are direct upconversion and direct downconversion operations. In various embodiments, the upconversion and downconversion operations producing the first receiver side baseband signal and the first receiver side image baseband signal are performed during a calibration mode of operation, e.g., processor 802 is configured to operate in a calibration mode of operation when performing those operations. In various embodiments, processor 802 is further configured to use a single oscillator frequency for transmission upconversion and receiver downconversion operations during a communications mode of operation.

Figure 9A:
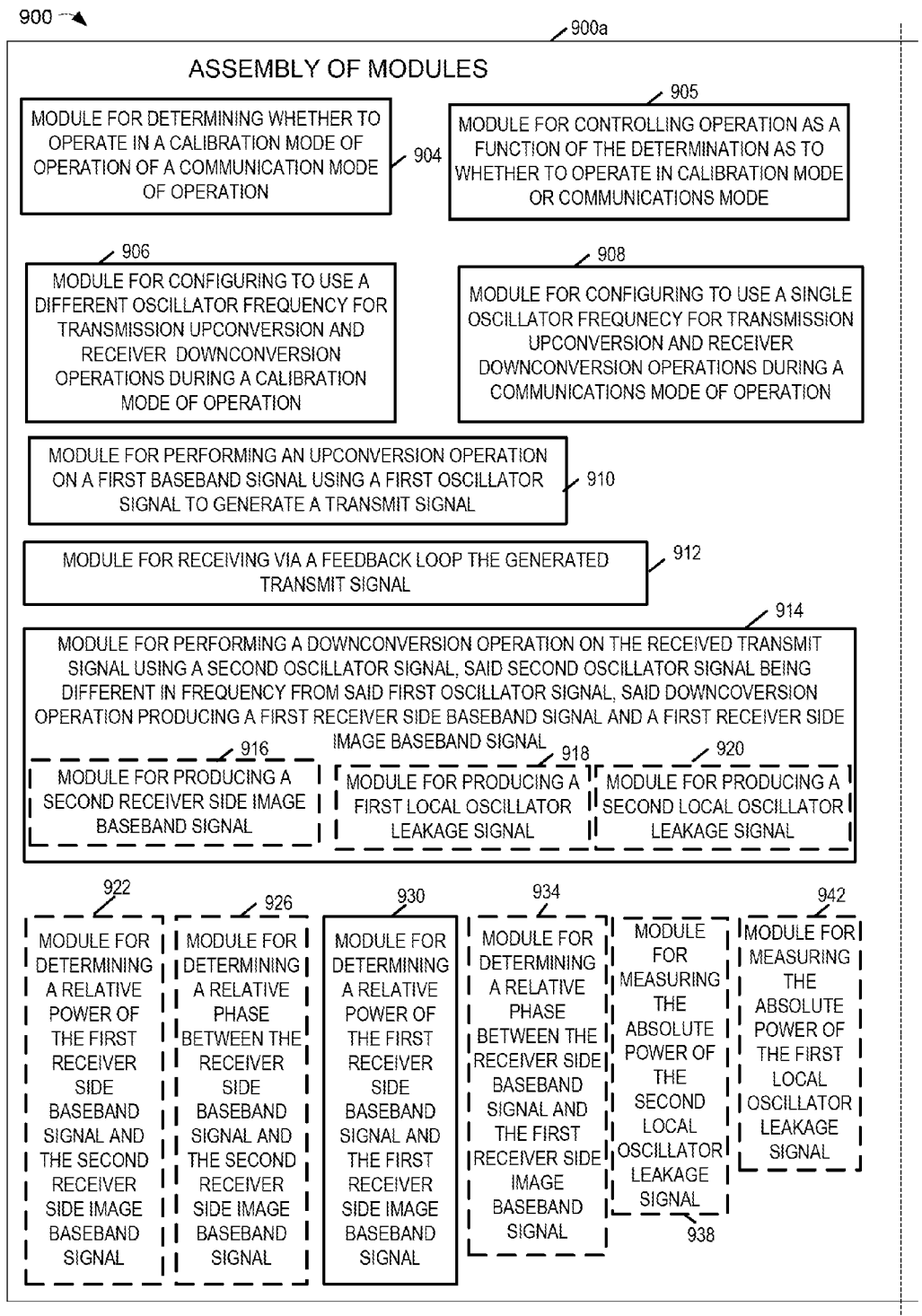
FIG. 9A is a first portion of an assembly of modules which can, and in some embodiments is, used in the wireless communications device illustrated in FIG. 8.
Figures 9, 9B:
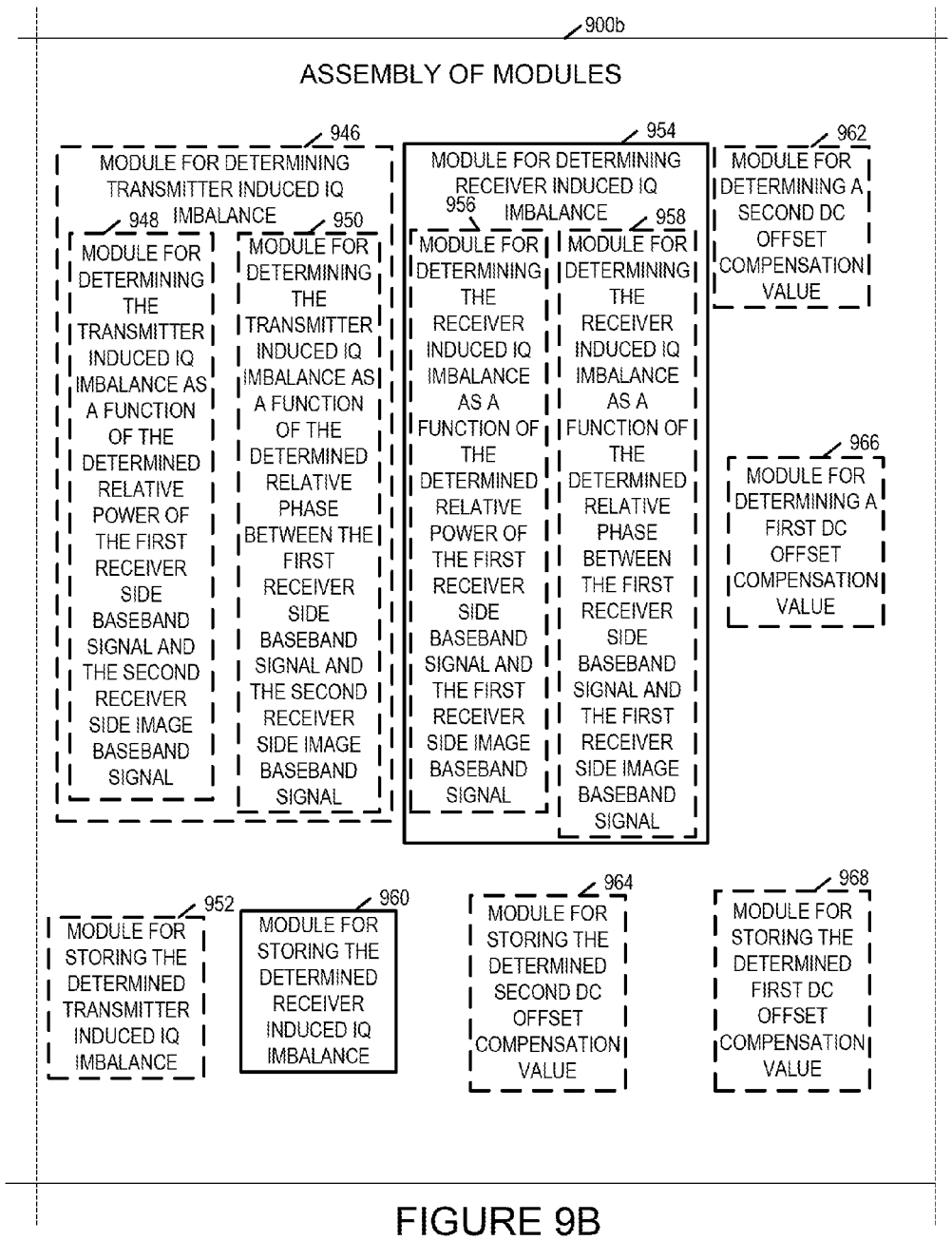
FIG. 9B is a second portion of an assembly of modules which can, and in some embodiments is, used in the wireless communications device illustrated in FIG. 8.
Figure 9C:
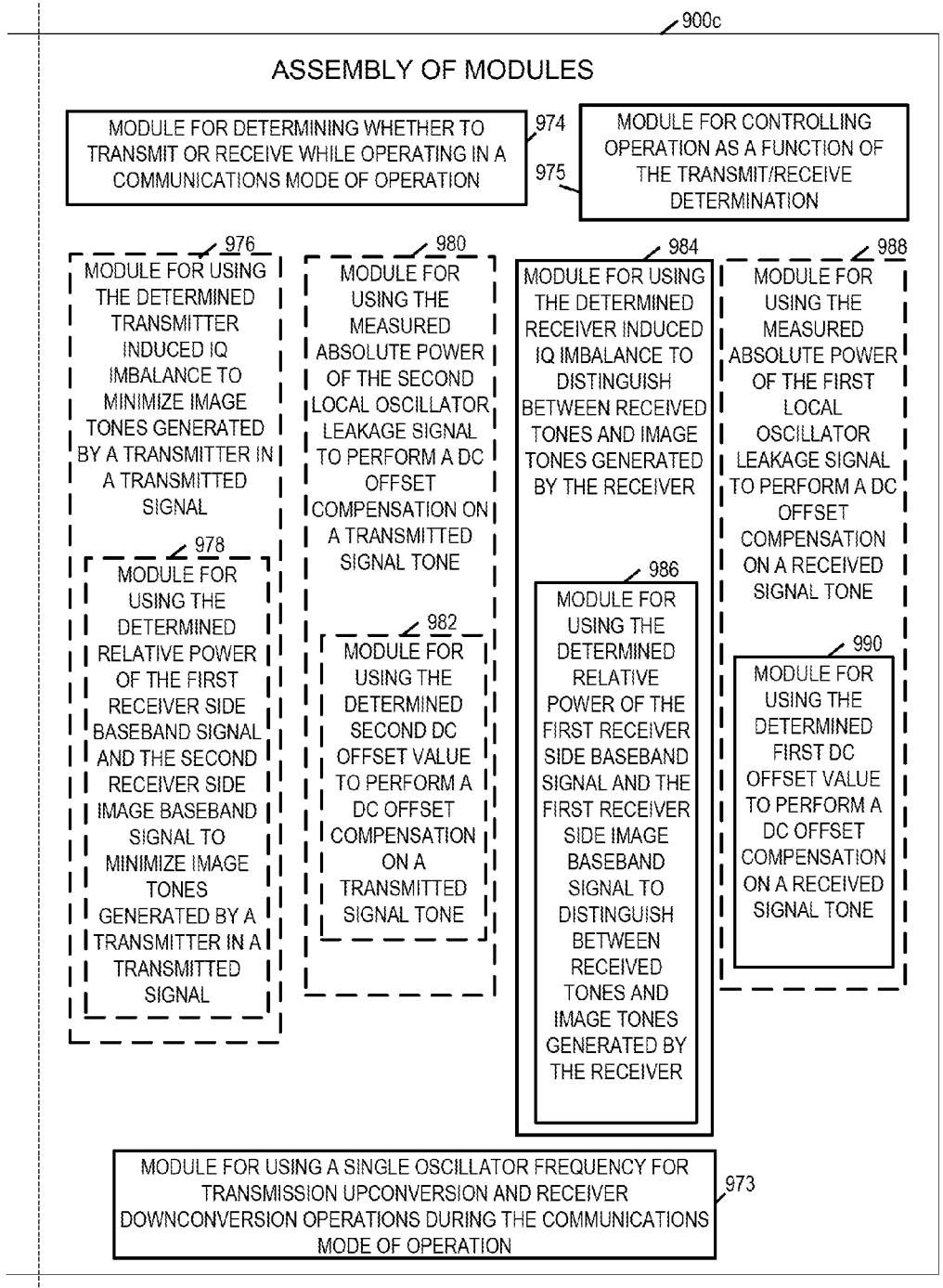
FIG. 9C is a third portion of an assembly of modules which can, and in some embodiments is, used in the wireless communications device illustrated in FIG. 8.

FIG. 9, comprising the combination of FIG. 9A, FIG. 9B and FIG. 9C is an assembly of modules 900 which can, and in some embodiments is, used in the wireless communications device 800 illustrated in FIG. 8. Assembly of modules 900 includes portion 900a, potion 900b and portion 900c. The modules in the assembly 900 can be implemented in hardware within the processor 802 of FIG. 8, e.g., as individual circuits. Alternatively, the modules may be implemented in software and stored in the memory 804 of the communications device 800 shown in FIG. 8. While shown in the FIG. 8 embodiment as a single processor, e.g., computer, it should be appreciated that the processor 802 may be implemented as one or more processors, e.g., computers. When implemented in software the modules include code, which when executed by the processor, configure the processor, e.g., computer, 802 to implement the function corresponding to the module. In some embodiments, processor 802 is configured to implement each of the modules of the assembly of modules 800. In embodiments where the assembly of modules 800 is stored in the memory 804, the memory 804 is a computer program product comprising a computer readable medium comprising code, e.g., individual code for each module, for causing at least one computer, e.g., processor 802, to implement the functions to which the modules correspond.

Completely hardware based or completely software based modules may be used. However, it should be appreciated that any combination of software and hardware (e.g., circuit implemented) modules may be used to implement the functions. As should be appreciated, the modules illustrated in FIG. 9 control and/or configure the communications device 800 or elements therein such as the processor 802, to perform the functions of the corresponding steps illustrated and/or described in the method of flowchart 700 of FIG. 7.

Assembly of modules 900 includes a module 904 for determining whether to operate in a calibration mode of operation or a communications mode of operation, a module 905 for controlling operation as a function of the determination as to whether to operate in the calibration mode of operation of the communications mode of operation, a module 906 for configuring to use a different oscillator frequency for transmission upconversions and receiver downconversion operations during a calibration mode of operation, and a module 908 for configuring to use a single oscillator frequency for transmission upconversion and receiver downconversion operations during a communications mode of operation. Assembly of moduleS 900 further includes a module 910 for performing an upconversion operation on a first baseband signal using a first oscillator signal to generate a transmit signal, a module 912 for receiving, via feedback loop, the generated transmit signal from module 910, and a module 914 for performing a downconversion operation on the received transmit signal using a second oscillator signal, said second oscillator signal being different in frequency from said first oscillator signal, said downconversion operation producing a first receiver side baseband signal and a first receiver side image baseband signal. Module 914 for performing a downconversion operation further includes a module 916 for producing a second receiver side image baseband signal, a module 918 for producing a first local oscillator leakage signal, and a module 920 for producing a second local oscillator leakage signal.

Assembly of modules 900 further includes a module 922 for determining a relative power of the first receiver side baseband signal and the second receiver side image baseband signal, a module 926 for determining a relative phase between the receiver side baseband signal and the second receiver side image baseband signal, a module 930 for determining a relative power of the first receiver side baseband signal and the first receiver side image baseband signal, a module 934 for determining a relative phase between the receiver side baseband signal and the first receiver side image baseband signal, a module 938 for measuring the absolute power of the second local oscillator leakage signal and a module 942 for measuring the absolute power of the first local oscillator leakage signal. Assembly of modules 900 further includes a module 946 for determining transmitter induced IQ imbalance, a module 954 for determining receiver induced IQ imbalance, a module 962 for determining a second DC offset compensation value as a function of the measured absolute power of the second local oscillator leakage signal, a module 966 for determining a first DC offset compensation value as a function of the measured absolute power of the first local oscillator leakage signal, a module 952 for storing the determined transmitter induced IQ imbalance, a module 960 for storing the determined receiver induced IQ imbalance, a module 964 for storing the determined second DC offset compensation value, and a module 968 for storing the determined first DC offset compensation value. In various embodiments, module 946 includes one or more of: a module 948 for determining the transmitter induced IQ imbalance as a function of the determined relative power of the first receiver side baseband signal and the second receiver side image baseband signal and a module 950 for determining the transmitter induced IQ imbalance as a function of the determined relative phase between the first receiver side baseband signal and the second receiver side image baseband signal. In some embodiments, modules 948 and 950 work together to determine to the transmitter induced IQ imbalance. In various embodiments, module 954 includes one or more of: a module 956 for determining the receiver induced IQ imbalance as a function of the determined relative power of the first receiver side baseband signal and the first receiver side image baseband signal and a module 958 for determining the receiver induced IQ imbalance as a function of the determined relative phase between the first receiver side baseband signal and the first receiver side image baseband signal. In some embodiments modules 956 and 958 work together to determine the receiver induced IQ imbalance.

Assembly of modules 900 further includes a module 973 for using a single oscillator frequency for transmission upconversion and receiver downconversion operations during a communications mode of operation, a module 974 for determining whether to transmit or receive while operating in a communications mode of operation, a module 975 for controlling operation as a function of the transmit/receive determination of module 974, a module 976 for using the determined transmitter induced IQ imbalance to minimize image tones generated by a transmitter in a transmitted signal, a module 980 for using the measured absolute power of the second local oscillator leakage signal to perform a DC offset compensation on a transmitted signal tone, a module 984 for using the determined receiver induced IQ imbalance to distinguish between received tones and image tones generated by the receiver, and a module 988 for using the measured absolute power of the first local oscillator leakage signal to perform a DC offset compensation on a received signal tone. Module 976 includes a module 978 for using the determined relative power of the first receiver side baseband signal and the second receiver side image baseband signal to minimize image tones generated by a transmitter in a transmitted signal. Module 980 includes a module 982 for using the determined second DC offset compensation value to perform a DC offset compensation on a transmitted signal tone. Module 984 includes a module 986 for using the determined relative power of the first receiver side baseband signal and first receiver side image baseband signal to distinguish between received tones and image tones generated by a receiver. Module 988 includes a module 990 for using the determined first DC offset value to perform a DC offset compensation on a received signal tone.

In one exemplary embodiment, the first baseband signal is a signal at f; the first oscillator frequency is fc(Tx); the second oscillator frequency is fc(Rx), the first receiver side baseband signal is a signal at fc(Tx)+f−fc(Rx); the second receiver side image baseband signal is a signal at fc(Tx)−f−fc(Rx); the first receiver side image baseband signal is a signal at fc(Rx)−(fc(Tx)+f); the second local oscillator leakage signal is a signal at frequency fc(Tx)−fc(Rx); and the first local oscillator leakage signal is a signal at fc(Rx)−fc(Rx).

Figure 10:
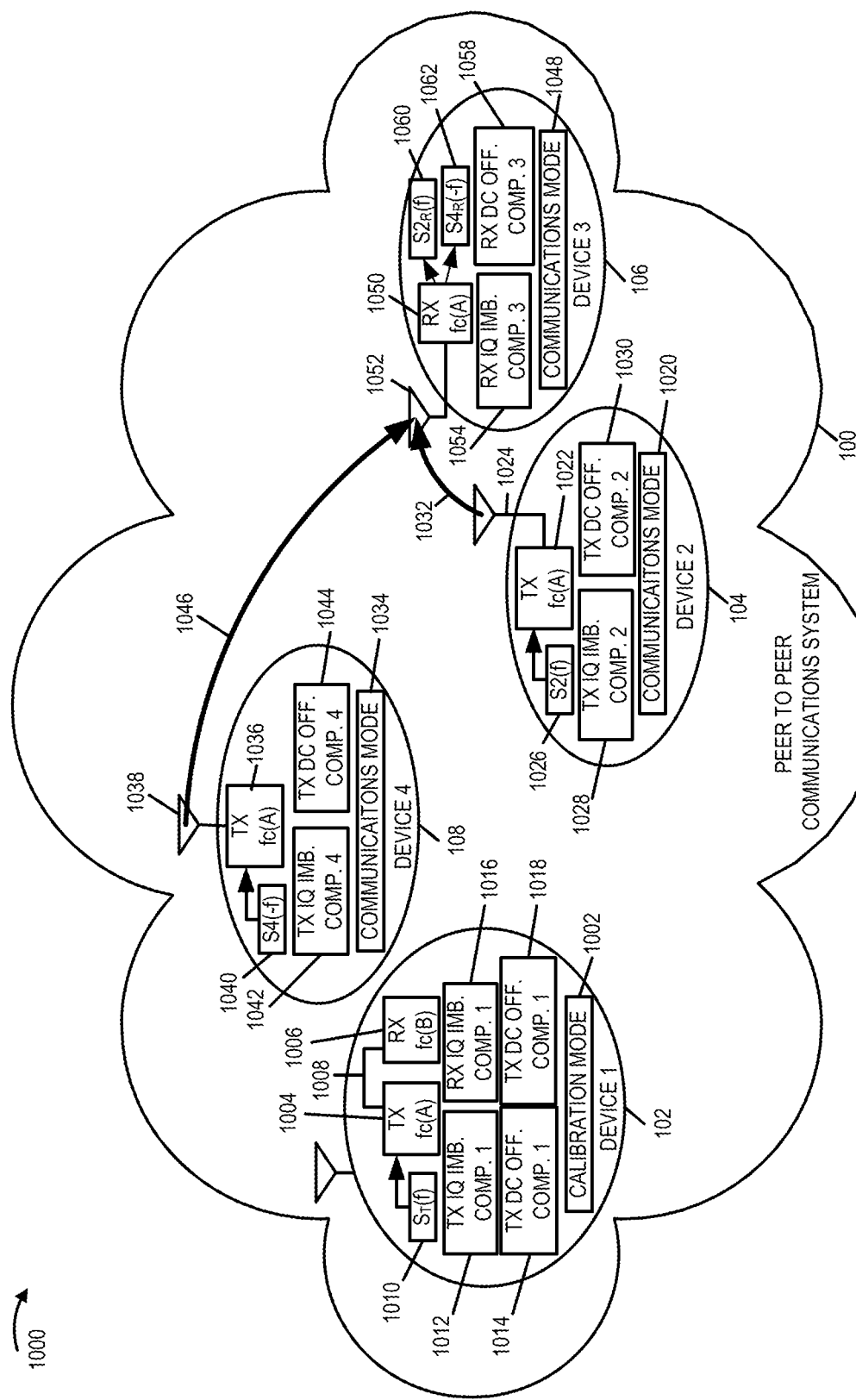
FIG. 10 is a drawing illustrating exemplary features and exemplary signaling in accordance with some embodiments.

FIG. 10 is a drawing 1000 illustrating exemplary features and exemplary signaling in accordance with some embodiments. The exemplary peer to peer communications system 100 of FIG. 1 is included in FIG. 10. Exemplary wireless communications devices (device 1 102, device 2 104, device 3 106, device 4 108) are shown.

In FIG. 10, device 1 102 is shown to be in a calibration mode of operation as indicated by box 1002, while devices (device 2 104, device 3 106, device 4 108) are shown to be in a communications mode of operation as indicated by boxes (1020, 1048, 1034), respectively. Each of the devices (102, 104, 106, 108) may be in a calibration mode during some time interval or intervals and may be in a communications mode of operation during other time intervals.

Device 1 102, which is in calibration mode, has set its transmitter mode 1004 to use carrier frequency fc(A) for its upconversion operations and has set its receiver module 1006 to use carrier frequency fc(B) for its receiver module for its downconversion operations. Baseband test signal $S_T(f)$ at frequency tone f is input to the transmitter module 1004 which performs an upconversion operation, then the resulting signal is sent to the receiver module 1006 via feedback loop connection 1008. The receiver module 1006 performs downconversion and obtains a receiver side baseband signal, a first receiver side image signal, a second receiver side image signal, a first local oscillator leakage signal and a second local oscillator leakage signal. Relative power and relative phase measurements are used, e.g., in accordance with methods described in flowchart 400 of FIG. 4 and/or flowchart 700 of FIG. 7, to determine transmitter IQ imbalance compensation information for device 1 1012 and receiver IQ imbalance compensation information for device 1 1016. Absolute power measurements are performed, e.g., in accordance with methods described in flowchart 400 of FIG. 4 and/or flowchart 700 of FIG. 7, to determine transmitter DC offset compensation information for device 1 1014 and receiver DC offset compensation information for device 1 1018. The determined compensation information (1012, 1014, 1016, 1018) is stored and available for use at a later time, e.g., when device 1 is operating in a communications mode of operation.

Device 2 104, which is in communications mode, has set its transmitter module 1022 to use carrier frequency $f_C(A)$. Device 2 104 wants to communicate baseband signal S2(f) 1026 at baseband tone frequency f. Device 2 104 performs upconversion and compensation using its stored transmitter IQ imbalance compensation information 1028 and transmitter DC offset compensation information 1030. Signal 1032 is generated and transmitted via antenna 1024 which includes a component at tone frequency fc(A)+f. The image tone signal, typically output due to IQ transmitter imbalance, which would typically be present at frequency $f_C(A)$−f has been substantially eliminated or significantly reduced due to the use of TX IQ imbalance compensation. The DC tone leakage signal, which would typically be present at frequency $f_C(A)$, has been substantially eliminated or significantly reduced due to the use of TX DC offset compensation.

Device 4 108, which is in communications mode, has set its transmitter module 1036 to use carrier frequency $f_C(A)$. Device 4 108 wants to communicate baseband signal S4(−f) 1040 at baseband tone frequency −f. Device 4 108 performs upconversion and compensation using its stored transmitter IQ imbalance compensation information 1042 and transmitter DC offset compensation information 1044. Signal 1046 is generated and transmitted via antenna 1038 which includes a component at tone frequency fc(A)−f. The image tone signal, typically output due to IQ transmitter imbalance, which would typically be present at frequency $f_C(A)$+f has been substantially eliminated or significantly reduced due to the use of TX IQ imbalance compensation. The DC tone leakage signal, which would typically be present at frequency $f_C(A)$, has been substantially eliminated or significantly reduced due to the use of TX DC offset compensation.

Device 3 106, which is in communications mode, has set its receiver module 1050 to use carrier frequency $f_C(A)$. Device 3 106 receives signal 1046 and signal 1032 via antenna 1052. Receiver module 1054 downconverts the received signals and uses RX IQ imbalance compensation information and RX DC offset compensation information 1058 to compensate the downconverted signals, to obtain recovered signals $S2_R(f)$ at baseband tone f and $S4_R(-f)$ at baseband tone −f. The use of RX IQ imbalance information facilitates the removal of a receiver image signals, and use of RX receiver DC offset compensations facilitates the removal of a receiver introduced DC leakage tone signal. Thus, signal $S2_R(f)$ and $S4_R(-f)$ are reasonable representations of signal $S_2(f)$ and $S_4(-f)$.

In some embodiments, the use of DC offset compensation in the receiver and/or transmitter facilitates the use of the DC tone to carry information. In some such embodiments, information is communicated using the DC tone.

Various features and aspects of some, but not necessarily all, embodiments will be described below. Various embodiments are directed to solving the problem of measuring the IQ imbalance and DC offset in both the transmitter and receiver RF chains of a wireless transceiver. Various components of some embodiments include:

1. A "loop-back" path between the transmitter and receiver RF chains which allows a generated transmission signal to be received.
2. Estimating the magnitude and/or phase of the impairment tones at base-band, e.g., using an FFT at the receiver.
3. Tuning the frequency of the downconversion signal of the receiver RF chain to be different from the frequency of the upconversion signal of the transmitter RF chain, e.g., by at least the FFT tone spacing.
4. Sending a single-tone signal or a group of single-tone signals at a time.

The existence of a physical "loop-back" between the transmitter and receiver RF chains, in some embodiments, is such that a generated transmission signal can be simultaneously received. In addition, in some embodiments, the receiver observes the magnitude and phase of the received signal, e.g., using an FFT. The measurement process includes the transmitter generating a baseband single-tone signal whose baseband frequency f is aligned with one of the tones, e.g., one of the tones of the FFT. For example, if the base-band sampling rate is 5 MHz and the FFT size used is 512, the transmitter, in some embodiments, generates a baseband tone at frequencies spaced by df=(5/512) MHz.

The transmitter then modulates or upconverts the baseband tone to RF frequency fc(TX)+f, using a carrier frequency fc(TX). This creates an IQ imbalance image tone at frequency fc(TX)−f and a DC offset at the carrier frequency fc(TX). The receiver's downconversion signal is tuned to a frequency fc(RX) which differs from fc(TX) by an integer multiple of the base-band tone spacing df.

Figure 11:
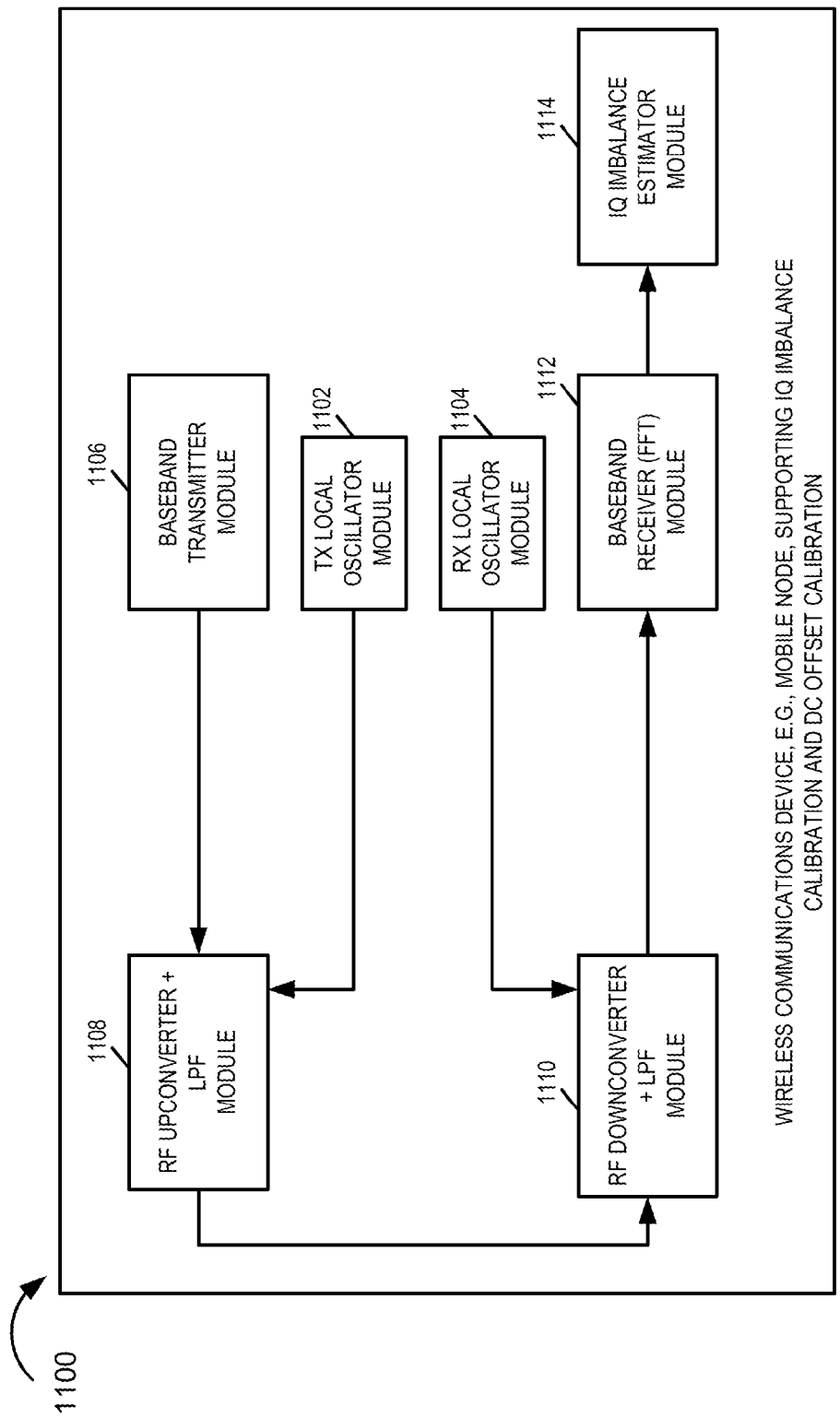
FIG. 11 is a drawing of an exemplary wireless communications device which includes modules for implementing a method of IQ imbalance and DC offset calibration in accordance with some embodiments.

FIG. 11 is a drawing of an exemplary wireless communications device 1100 which includes modules for implementing a method of IQ imbalance and DC offset calibration in accordance with some embodiments. Exemplary wireless communications device 1100 includes TX local oscillator 1102, RX local oscillator 1104, baseband transmitter 1106, RF upconverter+LPF (low pass filter) 1108, RF downconverter+LPF 1110, baseband receiver (FFT) 1112, and IQ imbalance estimator 1114. In some embodiments, the TX and RX local oscillators (1102, 1104) are actually rational multiples of the same signal source.

The signal sent by the transmitter is received via the loopback link. The received signal is a tone at frequency fc(TX)+f, corrupted by the receiver-side IQ imbalance image tone at frequency 2fc(RX)−(fc(TX)+f) and a receiver-side DC offset tone at the receiver's downconversion frequency fc(RX). In addition to that, the received signal also has a tone at frequency fc(TX)−f due to transmitter-side IQ imbalance, and a tone at frequency fc(TX) due to transmitter-side DC offset.

Figure 12:
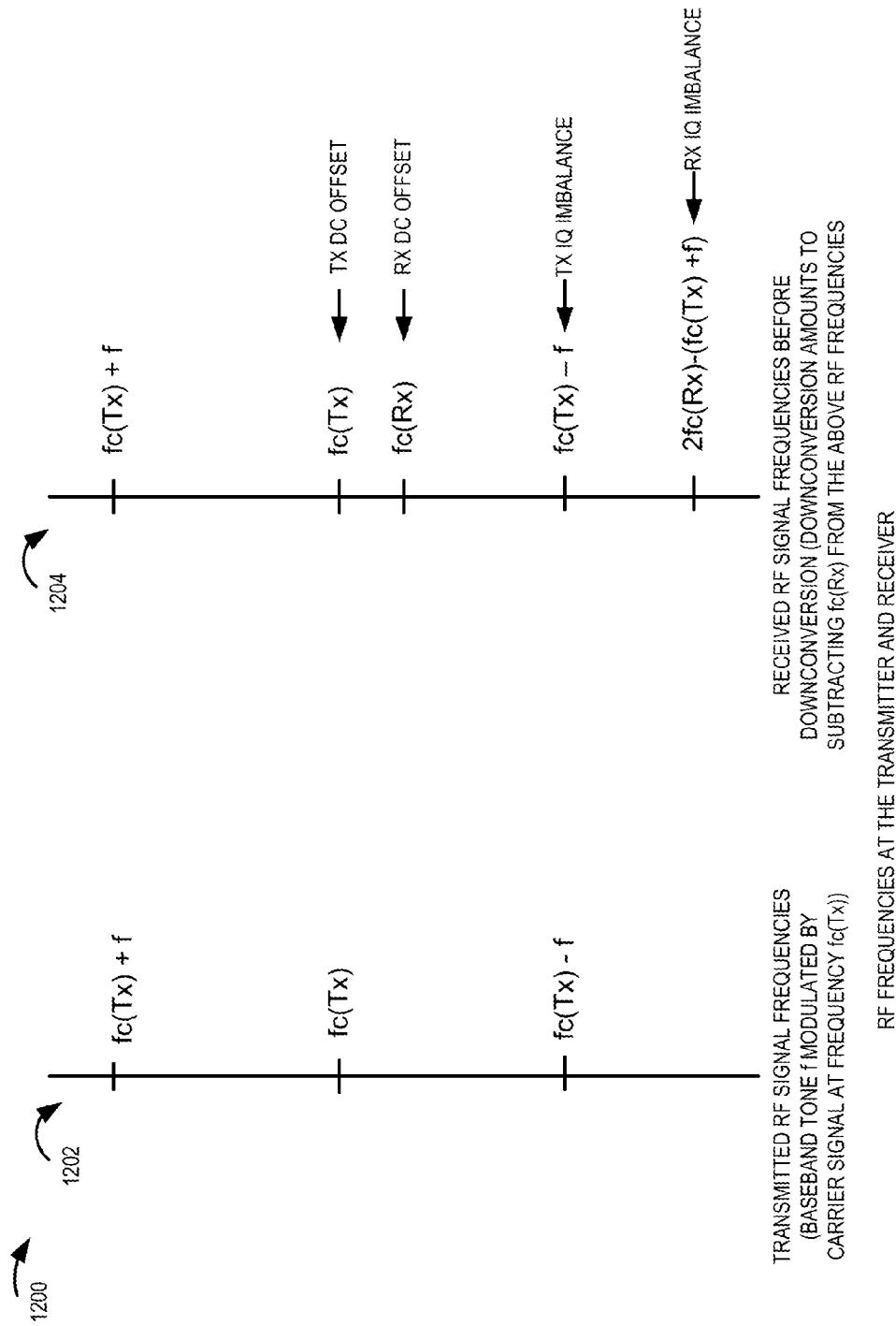
FIG. 12 illustrates transmitted RF signal frequencies of interest and received RF signal frequencies of interest associated with IQ imbalance calibration and DC offset calibration in accordance with an exemplary embodiment.

Drawing 1202 of FIG. 12 illustrates transmitted RF signal frequencies of interest. The baseband tone f is modulated by the carrier signal at frequency $f_C(Tx)$ resulting in a signal at frequency fc(Tx)+f. Due to transmitter IQ imbalance a undesired signal occurs at frequency fc(Tx)−f. In addition, there is an undesired transmitter side DC offset tone signal at frequency fc (Tx).

Drawing 1204 of FIG. 12 illustrates received RF signal frequencies of interest before downconversion. Downconversion amounts to subtracting $f_C(Rx)$ from the frequencies shown in drawing 1204. In drawing 1204, the signal being communicated occurs at frequency fc(Tx)+f. The signal component at $f_C(Tx)$ corresponds to transmitter DC offset. The signal at fc(Tx)−f corresponds to transmitter IQ imbalance. The tone at frequency 2fc(RX)−(fc(TX)+f) is of interest because it corresponds to the receiver IQ imbalance image tone, and the tone at fc(RX) is of interest because it corresponds to a receiver-side DC offset tone at the receiver's downconversion frequency fc(RX).

The net result is that the receiver is able to distinguish between the transmitter-side and receiver-side IQ imbalance and DC offset tones because they do not overlap in frequency. This is due to the fact that the receiver-side downconversion signal is tuned to a different frequency than the transmitter-side upconversion signal so that the impairment tones do not overlap on the same frequencies.

To obtain the IQ imbalance and DC offset measurements, in some embodiments, the receiver then performs an FFT on the signal after downconversion using frequency fc(RX). The following measurements, in some embodiments, are then performed:

1. To obtain the receiver-side IQ imbalance measurement, the receiver estimates the relative magnitude and phase of the received tones at baseband frequencies fc(TX)−fc(RX)+f and its negative frequency.
2. To obtain the transmitter-side IQ imbalance measurement, the receiver estimates the relative magnitude and phase of the received tones at baseband frequencies fc(TX)−fc(RX)+f and fc(TX)−fc(RX)−f.
3. To obtain the receiver-side DC offset measurement, the receiver estimates the magnitude of the received tone at baseband frequency 0.
4. To obtain the transmitter-side DC offset measurement, the receiver estimates the magnitude of the received tone at baseband frequency fc(TX)−fc(RX).

Since the IQ imbalance impairment is a function of frequency, the above procedure, in some embodiments, is repeated for each of the baseband tones. In some embodiments only one tone may be transmitted at any given time, while in others multiple tones can be, and are, sent simultaneously. Furthermore, this measurement may, and in some embodiments is, repeated, e.g., at periodic intervals, since the impairments may vary with time.

The techniques of various embodiments may be implemented using software, hardware and/or a combination of software and hardware. Various embodiments are directed to apparatus, e.g., mobile nodes such as mobile terminals, base stations, communications system. Various embodiments are also directed to methods, e.g., method of controlling and/or operating mobile nodes, base stations and/or communications systems, e.g., hosts. Various embodiments are also directed to machine, e.g., computer, readable medium, e.g., ROM, RAM, CDs, hard discs, etc., which include machine readable instructions for controlling a machine to implement one or more steps of a method.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

In various embodiments nodes described herein are implemented using one or more modules to perform the steps corresponding to one or more methods, for example, signal processing, signal generation and/or transmission steps. Thus, in some embodiments various features are implemented using modules. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium including machine executable instructions for causing a machine, e.g., processor and associated hardware, to perform one or more of the steps of the above-described method(s). Some embodiments are directed to a device, e.g., communications node, including a processor configured to implement one, multiple or all of the steps of one or more methods of the invention.

In some embodiments, the processor or processors, e.g., CPUs, of one or more devices, e.g., communications nodes such as access nodes and/or wireless terminals, are configured to perform the steps of the methods described as being performed by the communications nodes. The configuration of the processor may be achieved by using one or more modules, e.g., software modules, to control processor configuration and/or by including hardware in the processor, e.g., hardware modules, to perform the recited steps and/or control processor configuration. Accordingly, some but not all embodiments are directed to a device, e.g., communications node, with a processor which includes a module corresponding to each of the steps of the various described methods performed by the device in which the processor is included. In some but not all embodiments a device, e.g., communications node, includes a module corresponding to each of the steps of the various described methods performed by the device in which the processor is included. The modules may be implemented using software and/or hardware.

Some embodiments are directed to a computer program product comprising a computer-readable medium comprising code for causing a computer, or multiple computers, to implement various functions, steps, acts and/or operations, e.g. one or more steps described above. Depending on the embodiment, the computer program product can, and sometimes does, include different code for each step to be performed. Thus, the computer program product may, and sometimes does, include code for each individual step of a method, e.g., a method of controlling a communications device or node. The code may be in the form of machine, e.g., computer, executable instructions stored on a computer-readable medium such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a communications device or other device described in the present application.

While described in the context of an OFDM system, at least some of the methods and apparatus of various embodiments are applicable to a wide range of communications systems including many non-OFDM and/or non-cellular systems.

Numerous additional variations on the methods and apparatus of the various embodiments described above will be apparent to those skilled in the art in view of the above description. Such variations are to be considered within the scope. The methods and apparatus may be, and in various embodiments are, used with CDMA, orthogonal frequency division multiplexing (OFDM), and/or various other types of communications techniques which may be used to provide wireless communications links between communications devices. In some embodiments one or more communications devices are implemented as access points which establish communications links with mobile nodes using OFDM and/or CDMA and/or may provide connectivity to the internet or another network via a wired or wireless communications link. In various embodiments the mobile nodes are implemented as notebook computers, personal data assistants (PDAs), or other portable devices including receiver/transmitter circuits and logic and/or routines, for implementing the methods.

What is claimed is:

1. A method comprising:
performing an upconversion operation on a first baseband signal using a first oscillator signal to generate a transmit signal;
receiving via a feedback loop the generated transmit signal;
performing a downconversion operation on the received transmit signal using a second oscillator signal, said second oscillator signal being different in frequency from said first oscillator signal, said downconversion operation producing a first receiver side baseband signal, a first receiver side image baseband signal, and a first local oscillator leakage signal;
determining a relative power of the first receiver side baseband signal and first receiver side image baseband signal;
measuring the absolute power of the first local oscillator leakage signal; and
during a data transmission time period following said measurement of the absolute power of the first local oscillator leakage signal using said measured absolute power to perform a DC offset compensation operation on a transmitted signal tone.

2. The method of claim 1, wherein said upconversion and downconversion operations are direct upconversion and direct downconversion operations.

3. The method of claim 1, wherein said upconversion and downconversion operations are performed during a calibration mode of operation, the method further comprising:

using a single oscillator frequency for transmission upconversion and receiver downconversion operations during a communications mode of operation.

4. The method of claim 1, wherein said downconversion operation further produces a second receiver side image baseband signal, the method further comprising:
determining the relative power of the first receiver side baseband signal and second receiver side image baseband signal.

5. The method of claim 1, further comprising:
determining transmitter induced IQ imbalance as a function of the relative power of the first receiver side baseband signal and the first receiver side image baseband signal.

6. The method of claim 4, wherein the relative power of the first receiver side baseband signal and the first receiver side image baseband signal is used to determine transmitter introduced IQ imbalance; and
wherein the relative power of the first receiver side baseband signal and the second receiver side image baseband signal is used to determine the receiver introduced IQ imbalance.

7. A method comprising:
performing an upconversion operation on a first baseband signal using a first oscillator signal to generate a transmit signal;
receiving via a feedback loop the generated transmit signal;
performing a downconversion operation on the received transmit signal using a second oscillator signal, said second oscillator signal being different in frequency from said first oscillator signal, said downconversion operation producing a first receiver side baseband signal, a first receiver side image baseband signal, and a second local oscillator leakage signal;
determining a relative power of the first receiver side baseband signal and first receiver side image baseband signal;
measuring the absolute power of the second local oscillator leakage signal; and
during the data reception time period following said measurement of the absolute power of the second local oscillator leakage signal using said measured absolute power to perform a DC offset compensation operation on a received signal tone.

8. A wireless communications device comprising:
means for performing an upconversion operation on a first baseband signal using a first oscillator signal to generate a transmit signal;
means for receiving via a feedback loop the generated transmit signal;
means for performing a downconversion operation on the received transmit signal using a second oscillator signal, said second oscillator signal being different in frequency from said first oscillator signal, said downconversion operation producing a first receiver side baseband signal, a first receiver side image baseband signal and a first local oscillator leakage signal;
means for determining a relative power of the first receiver side baseband signal and first receiver side image baseband signal;
means for measuring the absolute power of the first local oscillator leakage signal; and
means for using, during a data transmission time period following said measurement of the absolute power of the first local oscillator leakage signal, said measured absolute power to perform a DC offset compensation operation on a transmitted signal tone.

9. The wireless communications device of claim 8, wherein said upconversion and downconversion operations are direct upconversion and direct downconversion operations.

10. The wireless communications device of claim 8, wherein said upconversion and downconversion operations are performed during a calibration mode of operation, the wireless communications device further comprising:
means for using a single oscillator frequency for transmission upconversion and receiver downconversion operations during a communications mode of operation.

11. The wireless communications device of claim 8, wherein said downconversion operation further produces a second receiver side image baseband signal, the wireless communications device further comprising:
means for determining the relative power of the first receiver side baseband signal and second receiver side image baseband signal.

12. The wireless communications device of claim 8, further comprising:
means for determining transmitter induced IQ imbalance as a function of the relative power of the first receiver side baseband signal and the first receiver side image baseband signal.

13. The wireless communications device of claim 11, wherein the relative power of the first receiver side baseband signal and the first receiver side image baseband signal is used to determine transmitter introduced IQ imbalance; and
wherein the relative power of the first receiver side baseband signal and the second receiver side image baseband signal is used to determine the receiver introduced IQ imbalance.

14. A computer program product for use in a wireless communications device, the computer program product comprising:
a non-transitory computer readable medium comprising:
code for causing at least one computer to perform an upconversion operation on a first baseband signal using a first oscillator signal to generate a transmit signal;
code for causing said at least one computer to receive via a feedback loop the generated transmit signal;
code for causing said at least one computer to perform a downconversion operation on the received transmit signal using a second oscillator signal, said second oscillator signal being different in frequency from said first oscillator signal, said downconversion operation producing a first receiver side baseband signal, a first receiver side image baseband signal, and a first local oscillator leakage signal;
code for causing said at least one computer to determine a relative power of the first receiver side baseband signal and first receiver side image baseband signal;
code for causing said at least one computer to measure the absolute power of the first local oscillator leakage signal; and
code for causing said at least one computer to use, during a data transmission time period following said measurement of the absolute power of the first local oscillator leakage signal, said measured absolute power to perform a DC offset compensation operation on a transmitted signal tone.

15. A wireless communications device comprising:
at least one processor configured to:
perform an upconversion operation on a first baseband signal using a first oscillator signal to generate a transmit signal;

receive via a feedback loop the generated transmit signal;

perform a downconversion operation on the received transmit signal using a second oscillator signal, said second oscillator signal being different in frequency from said first oscillator signal, said downconversion operation producing a first receiver side baseband signal, a first receiver side image baseband signal, and a first local oscillator leakage signal;

determine a relative power of the first receiver side baseband signal and first receiver side image baseband signal;

measure the absolute power of the first local oscillator leakage signal; and use, during a data transmission time period following said measurement of the absolute power of the first local oscillator leakage signal, said measured absolute power to perform a DC offset compensation operation on a transmitted signal tone;

and memory coupled to said at least one processor.

16. The wireless communications device of claim 15, wherein said upconversion and downconversion operations are direct upconversion and direct downconversion operations.

17. The wireless communications device of claim 15, wherein said upconversion and downconversion operations are performed during a calibration mode of operation, and wherein said at least one processor is further configured to:

use a single oscillator frequency for transmission upconversion and receiver downconversion operations during a communications mode of operation.

18. The wireless communications device of claim 15, wherein said downconversion operation further produces a second receiver side image baseband signal, and wherein said at least one processor is further configured to:

determine the relative power of the first receiver side baseband signal and second receiver side image baseband signal.

19. The wireless communications device of claim 15, wherein said at least one processor is further configured to:

determine transmitter induced IQ imbalance as a function of the relative power of the first receiver side baseband signal and the first receiver side image baseband signal.

20. A wireless communications device comprising:

means for performing an upconversion operation on a first baseband signal using a first oscillator signal to generate a transmit signal;

means for receiving, via a feedback loop, the generated transmit signal;

means for performing a downconversion operation on the received transmit signal using a second oscillator signal, said second oscillator signal being different in frequency from said first oscillator signal, said downconversion operation producing a first receiver side baseband signal, a first receiver side image baseband signal, and a second local oscillator leakage signal;

means for determining a relative power of the first receiver side baseband signal and first receiver side image baseband signal;

means for measuring the absolute power of the second local oscillator leakage signal; and means for using, during the data reception time period following said measurement of the absolute power of the second local oscillator leakage signal, said measured absolute power to perform a DC offset compensation operation on a received signal tone.

21. A computer program product for use in a wireless communications device, the computer program product comprising:

a non-transitory computer readable medium comprising:

code for causing at least one computer to perform an upconversion operation on a first baseband signal using a first oscillator signal to generate a transmit signal;

code for causing said at least one computer to receive via a feedback loop the generated transmit signal;

code for causing said at least one computer to perform a downconversion operation on the received transmit signal using a second oscillator signal, said second oscillator signal being different in frequency from said first oscillator signal, said downconversion operation producing a first receiver side baseband signal, a first receiver side image baseband signal, and a second local oscillator leakage signal;

code for causing said at least one computer to determine a relative power of the first receiver side baseband signal and first receiver side image baseband signal;

code for causing said at least one computer to measure the absolute power of the second local oscillator leakage signal; and code for causing said at least one computer to use, during the data reception time period following said measurement of the absolute power of the second local oscillator leakage signal, said measured absolute power to perform a DC offset compensation operation on a received signal tone.

22. A wireless communications device comprising:

at least one processor configured to:

perform an upconversion operation on a first baseband signal using a first oscillator signal to generate a transmit signal;

receive via a feedback loop the generated transmit signal;

perform a downconversion operation on the received transmit signal using a second oscillator signal, said second oscillator signal being different in frequency from said first oscillator signal, said downconversion operation producing a first receiver side baseband signal, a first receiver side image baseband signal, and a second local oscillator leakage signal; and determine a relative power of the first receiver side baseband signal and first receiver side image baseband signal;

measure the absolute power of the second local oscillator leakage signal; and code for causing said at least one computer to use, during the data reception time period following said measurement of the absolute power of the second local oscillator leakage signal, said measured absolute power to perform a DC offset compensation operation on a received signal tone; and memory coupled to said at least one processor.

* * * * *